(12) United States Patent
Kokubo et al.

(10) Patent No.: US 9,555,505 B2
(45) Date of Patent: Jan. 31, 2017

(54) FORGING METHOD

(75) Inventors: Sadao Kokubo, Kitakata (JP); Kazuo Igarashi, Kitakata (JP)

(73) Assignee: SHOWA DENKO K.K., Tokyo (JP)

( * ) Notice: Subject to any disclaimer, the term of this patent is extended or adjusted under 35 U.S.C. 154(b) by 629 days.

(21) Appl. No.: 14/002,376

(22) PCT Filed: Feb. 28, 2012

(86) PCT No.: PCT/JP2012/054974
§ 371 (c)(1),
(2), (4) Date: Nov. 11, 2013

(87) PCT Pub. No.: WO2012/118094
PCT Pub. Date: Sep. 7, 2012

(65) Prior Publication Data
US 2014/0054023 A1 Feb. 27, 2014

(30) Foreign Application Priority Data

Mar. 3, 2011 (JP) ................................. 2011-046260

(51) Int. Cl.
*B23P 15/00* (2006.01)
*B21C 23/18* (2006.01)
(Continued)

(52) U.S. Cl.
CPC .............. *B23P 15/26* (2013.01); *B21C 23/186* (2013.01); *B21K 23/00* (2013.01); *B21K 25/00* (2013.01);
(Continued)

(58) Field of Classification Search
CPC .......... B21K 23/00; B23P 15/26; B21D 53/02; B21D 53/022; F28F 3/02; H01L 23/3677; H01L 21/4878; H01L 2924/0002; B21C 23/186; B21C 23/18; Y10T 29/4935; B21J 5/02; B21J 5/022; B21J 9/02; B21J 13/02
(Continued)

(56) References Cited

U.S. PATENT DOCUMENTS 3,054,177 A * 9/1962 Duhamel ................ B21C 23/20
72/254
3,060,560 A * 10/1962 Biehl ...................... B21C 23/20
419/28
(Continued)

FOREIGN PATENT DOCUMENTS

JP 63-207435 A 8/1988
JP 05-190711 A 7/1993
(Continued)

OTHER PUBLICATIONS

Official Communication issued in International Patent Application No. PCT/JP2012/054974, mailed on May 22, 2012.

*Primary Examiner* — David Bryant
*Assistant Examiner* — Lawrence Averick
(74) *Attorney, Agent, or Firm* — Keating and Bennett, LLP

(57) ABSTRACT

The present invention is directed to a forging method for forming a heat sink 9 including a base board 91 and a plurality of pin fins 92 integrally formed on an upper surface of the base board 91. A back pressure applying pin 75 of a forging die for forming pin fins 92 are slidably arranged in a fin-forming hole 52. At the time of plastically deforming a forging blank W, a back pressure is applied by the back pressure applying pin to a metal material of the forging blank W flowed into the fin-forming hole 52. A concave portion 76 is formed on the restraining tip end face of the back pressure applying pin 75 for restraining the metal material, and a joining convex portion 93 is integrally
(Continued)

formed on a tip end of the pin fin 92 by the metal material filled in the concave portion 76.

10 Claims, 18 Drawing Sheets

(51) Int. Cl.
| | | |
|---|---|---|
| *B21K 23/00* | (2006.01) | |
| *B21K 25/00* | (2006.01) | |
| *H01L 21/48* | (2006.01) | |
| *H01L 23/367* | (2006.01) | |
| *F28F 3/02* | (2006.01) | |
| *B23P 15/26* | (2006.01) | |

(52) U.S. Cl.
CPC ............ *F28F 3/02* (2013.01); *H01L 21/4878* (2013.01); *H01L 23/3677* (2013.01); *H01L 2924/0002* (2013.01); *Y10T 29/4935* (2015.01)

(58) Field of Classification Search
USPC ........................................ 72/354.8, 352, 267
See application file for complete search history.

(56) References Cited

U.S. PATENT DOCUMENTS

| | | | | |
|---|---|---|---|---|
| 3,561,242 | A  * | 2/1971 | Biginelli | ................. B21C 23/14 |
| | | | | 72/256 |
| 5,369,301 | A  * | 11/1994 | Hayashi | .............. H01L 21/4882 |
| | | | | 165/80.3 |
| 6,851,186 | B2 * | 2/2005 | Liang | ..................... B21D 53/02 |
| | | | | 29/505 |
| 2004/0088860 | A1* | 5/2004 | Liang | ..................... B21D 53/02 |
| | | | | 29/890.03 |
| 2004/0188080 | A1* | 9/2004 | Gailus | ..................... F28F 13/00 |
| | | | | 165/185 |
| 2009/0205464 | A1* | 8/2009 | Takeuchi | ............... B21K 1/762 |
| | | | | 74/7 C |
| 2010/0208427 | A1 | 8/2010 | Horiuchi et al. | |

FOREIGN PATENT DOCUMENTS

| | | |
|---|---|---|
| JP | 10-032288 A | 2/1998 |
| JP | 11-126863 A | 5/1999 |
| JP | 2009-191938 A | 8/2009 |
| JP | 2010-192708 A | 9/2010 |

* cited by examiner

FORGING METHOD

TECHNICAL FIELD

The present invention relates to a forging method for forming a pin fin-type heat sink by die forging processing and its related technologies.

TECHNICAL BACKGROUND

Heat sinks are widely used for the purpose of lowering the temperature of a heat generating member, such as, e.g., a CPU or a chip set for use in a computer, a power transistor for use in an AV amplifier and/or an audio device, or an inverter for use in an electric automobile and/or a hybrid automobile (HV car).

For example, Patent Document 1 listed below discloses a technology for producing a heat sink equipped with a base board and a number of pin-shaped fins (pin fins) provided on a surface thereof by die forging processing.

PRIOR ART DOCUMENTS

Patent Documents

[Patent Document 1] Japanese Unexamined Laid-open Publication Application No. 2010-192708

SUMMARY OF INVENTION

Problems to be Solved by the Invention

As shown in the aforementioned Patent Document 1, in producing a heat sink by die forging processing, it is difficult to accurately form the length, etc., of each pin fin.

That is, a plurality of fin-forming holes for forming a plurality of pin fins are formed in a forging processing die, and a pressure is applied to a forging blank (metal material) to cause a plastic flow into the die to thereby form pin fins. It is, however, difficult to make the metal material flow into the plurality of fin-forming holes evenly in a proper balance, which makes it difficult to accurately match the length, etc., of each pin fin.

In the recent years, a technology for producing a pin fin-type heat sink by forging processing using a back pressure has been proposed. In this back pressure applying forging, back pressure applying pins are slidably inserted in the respective fin-forming holes of the die. When the metal material flows plastically, a pressure (back pressure) in a direction opposite to the flowing direction of the metal material into the fin-forming hole is applied by the back pressure applying pin.

In such a back pressure applying forging processing, the metal material can be flowed into each fin-forming hole of the die in an evenly balanced manner, so the length of each pin fin can be matched, resulting in a high degree of dimensional accuracy.

However, in the aforementioned back pressure applying forging processing, since the back pressure applying pins are slidably inserted in the fin-forming holes of the die, the metal material flows into the gap between the inner peripheral surface of the fin-forming hole and the outer peripheral surface of the back pressure applying pin, resulting in a formation of burrs at the tip end outer peripheral edge of the pin fin.

In a heat sink having burrs formed at the tip end outer peripheral edge of the pin fin, when a metal plate, etc., is to be joined to the tip end of each pin fin, the metal plate, etc., cannot be joined to the pin fin in a good condition since the portion of the burrs directly comes into contact with the metal plate.

By removing the burrs on the tip end of the pin fin by cutting before attaching the metal plate to the heat sink, the metal plate can be fixedly joined to the tip end of the pin fin without any difficulty. However, since such cutting process is less efficient compared to press working, performing such a cutting process results in deteriorated production efficiency.

On the other hand, there is a method for removing burrs formed at a tip end of a pin fin of a forged heat sink by press working. In this method, a punch is driven against the tip end of the pin fin to crush the burrs. In this method, since the burrs can be removed by highly efficient press working, high production efficiency can be maintained. However, when burrs formed at the tip end outer peripheral edge of the pin fin are crushed with a punch, the burrs bend inward and lies on the tip end surface of the pin fin. Therefore, step portions are formed on the tip end face of the pin fin by the crushed burrs. When step portions are formed on the tip end face of the pin fin in this way, it becomes difficult to join the metal plate to each pin fin in a good condition.

Preferred embodiments of the present invention are made in view of the abovementioned and/or other problems in the related arts. The preferred embodiments of the present invention significantly improve upon existing methods and/or devices.

The present invention was made in view of the aforementioned problems, and aims to provide a forging method and its related technologies capable of efficiently producing a pin fin-type heat sink in which a metal plate, etc., can be fixedly joined to a tip end of a pin fin without difficulty.

The other objects and advantages of the present invention will be apparent from preferred embodiments described below.

Means for Solving the Problems

In order to attain the aforementioned objects, the present invention has the following structure.

[1] A forging method for forming a heat sink including a base board and a plurality of pin fins integrally formed on at least one surface of the base board by plastically deforming a forging blank by die forging processing, the method comprising:

arranging a back pressure applying pin in a fin-forming hole for forming the pin fin in a slidable manner, the fin-forming hole being formed in a forging die;

applying a back pressure to a metal material of the forging blank flowing into the fin-forming hole with the back pressure applying pin at a time of plastically deforming the forging blank;

forming a concave portion on a restraining tip end face of the back pressure applying pin for restraining the metal material; and integrally forming a joining convex portion on a tip end of the pin fin by the metal material filled in the concave portion.

[2] The forging method as recited in Item 1, wherein the joining convex portion of the pin fin is formed so as to be protruded than a thin protruded portion formed at a tip end outer peripheral edge of the pin fin.

[3] The forging method as recited in Item 2, wherein the thin protruded portion is formed by burrs.

[4] The forging method as recited in any one of Items 1 to 3, wherein a tip end of the joining convex portion of the pin fin is formed into a flat surface.

[5] The forging method as recited in any one of Items 1 to 4, wherein the forging die includes a punch and a die, and wherein the fin-forming hole is provided in the punch.

[6] The forging method as recited in any one of Items 1 to 5, wherein the forging die includes a punch and a die, and wherein the fin-forming hole is provided in the die.

[7] A forging device for forming a heat sink including a base board and a plurality of pin fins integrally formed on at least one surface of the base board by plastically deforming a forging blank by die forging processing, wherein a back pressure applying pin is arranged in a fin-forming hole for forming the pin fin in a slidable manner, the fin-forming hole being formed in a forging die, wherein a concave portion is formed on a restraining tip end face of the back pressure applying pin for restraining a metal material of the forging blank so that a joining convex portion is integrally formed on a tip end of the pin fin by the metal material filled in the concave portion.

[8] A heat sink formed by the forging method as recited in any one of Items 1 to 6.

[9] A heat sink including a base board and a plurality of pin fins integrally formed on at least one surface of the base board and formed by die forging processing, wherein a joining convex portion is integrally formed on a tip end of the pin fin.

[10] A heat sink having a heat transfer plate, wherein a heat transfer plate is fixedly joined to tip ends of the plurality of pin fins of the heat sink as recited in Item 8 or 9.

[11] A production method of a heat sink including a heat transfer plate, the method comprising:

a step of obtaining a heat sink by a forging method as recited in any one of Items 1 to 6; and a step of fixedly joining a heat transfer plate to tip ends of a plurality of pin fins without removing thin protruded portions formed at tip end outer peripheral edges of the plurality of pin fins of the heat sink.

[12] A production method of a heat sink including a heat transfer plate, the method comprising:

a step of obtaining a heat sink by a forging method as recited in any one of Items 1 to 6;

a correction step of adjusting protruding amounts of joining convex portions of a plurality of pin fins of the heat sink by pressing a corrective punch having a flat pressing surface against tip ends of the plurality of pin fins; and a joining step of fixedly joining a heat transfer plate to tip ends of the plurality of pin fins after performing the correction step.

[13] A correction method of a heat sink, comprising:

a step of obtaining a heat sink by a forging method as recited in any one of Items 1 to 6; and a correction step of adjusting protruding amounts of joining convex portions of a plurality of pin fins of the heat sink by pressing a corrective punch having a flat pressing surface against tip ends of the plurality of pin fins.

Effects of the Invention

According to the forging method of the invention [1], the heat sink in which a joining convex portion is formed at the tip end of the pin fin is formed. Therefore, when fixedly joining a heat transfer plate, such as, e.g., a metal plate, to the tip ends of the pin fins, an excellent joint condition can be obtained even if there exist burrs at the tip end outer peripheral edge of the pin fin since the joining convex portion comes into contact with the heat transfer plate.

Furthermore, since there is no need to remove burrs of the heat sink, the number of processing steps can be reduced, which in turn can improve the production efficiency.

According to the forging method of the inventions [2] and [3], since the joining convex portion is protruded than the thin protruded portion or the burrs formed on the tip end outer periphery of the pin fin, when the heat transfer plate is fixedly joined to the tip end of the pin fin, the joining convex portion can be more assuredly joined to the heat transfer plate, resulting in an even better joined condition.

According to the forging method of the invention [4], the tip end of the joining convex portion is formed into a flat surface. Therefore, when a heat transfer plate is fixedly joined to the tip end of the pin fin, the joining area of the joining convex portion and the heat transfer plate can be large, which enables joining in an even better condition.

According to the forging method of the inventions [5] and [6], the aforementioned effects can be more assuredly obtained.

According to the forging device of the invention [7], the same effects as mentioned above can be obtained.

According to the heat sink of the invention [8] and [9], in the same manner as mentioned above, a heat transfer plate can be fixedly joined to the tip end of the pin fin in a good condition.

According to the aforementioned invention [10], a heat sink having a heat transfer plate in which the heat transfer plate is fixedly joined to the tip end of the pin fin in a good condition can be provided.

According to the aforementioned inventions [11] and [12], a heat sink having a heat transfer plate in which the heat transfer plate is fixedly joined to the tip end of the pin fin in a good condition can be produced.

According to the aforementioned invention [13], the protruding amount of the joining convex portion of the heat sink can be adjusted.

EMBODIMENTS FOR CARRYING OUT THE INVENTION

Figure 1:
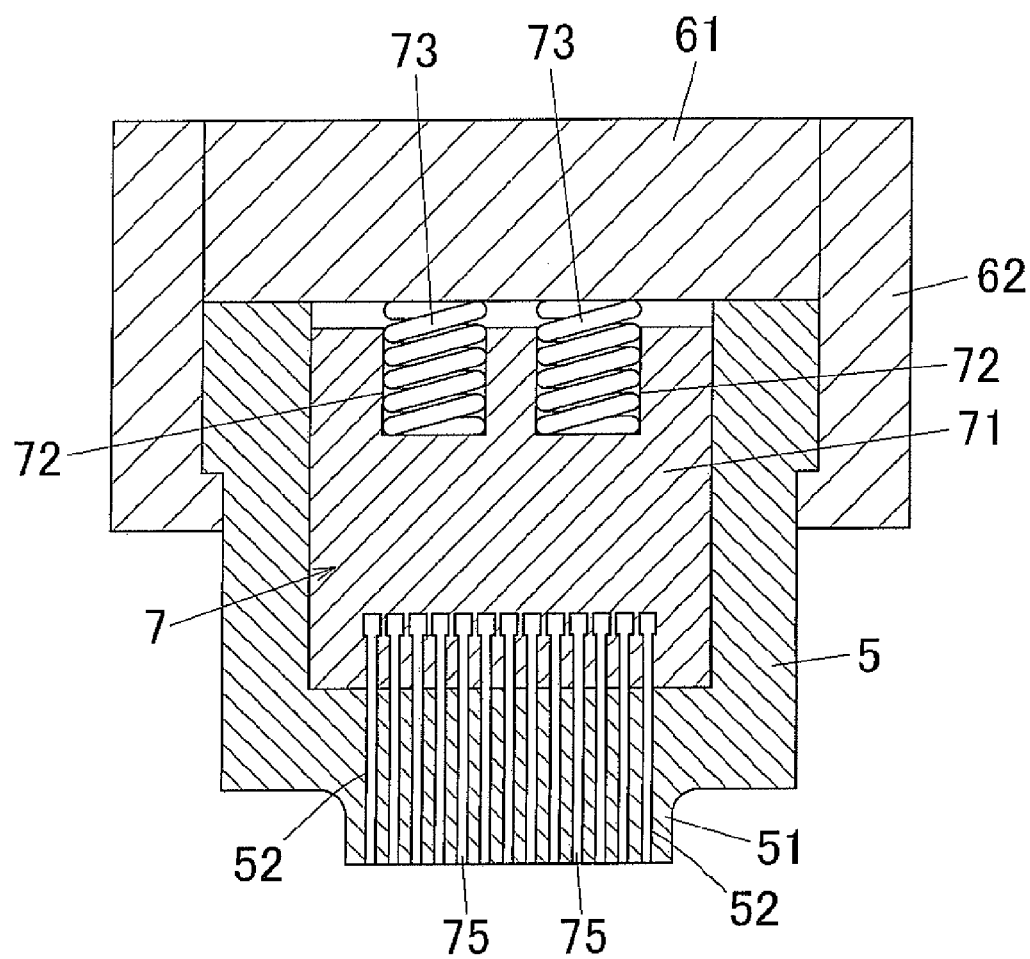
FIG. 1 is a schematic front cross-sectional view showing a forging device according to an embodiment in which a punch is in an elevated state.
Figure 1:
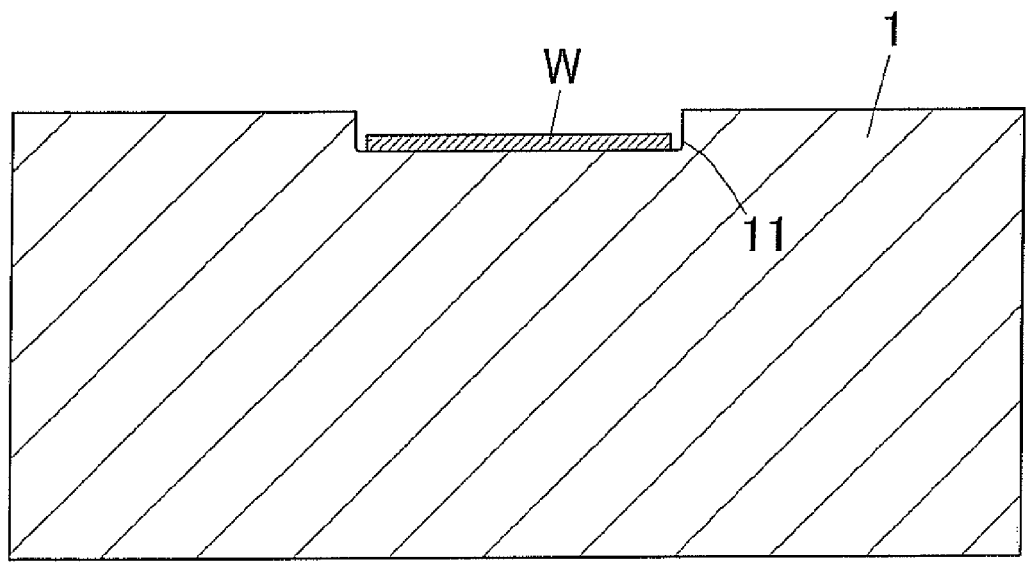
Figure 2:
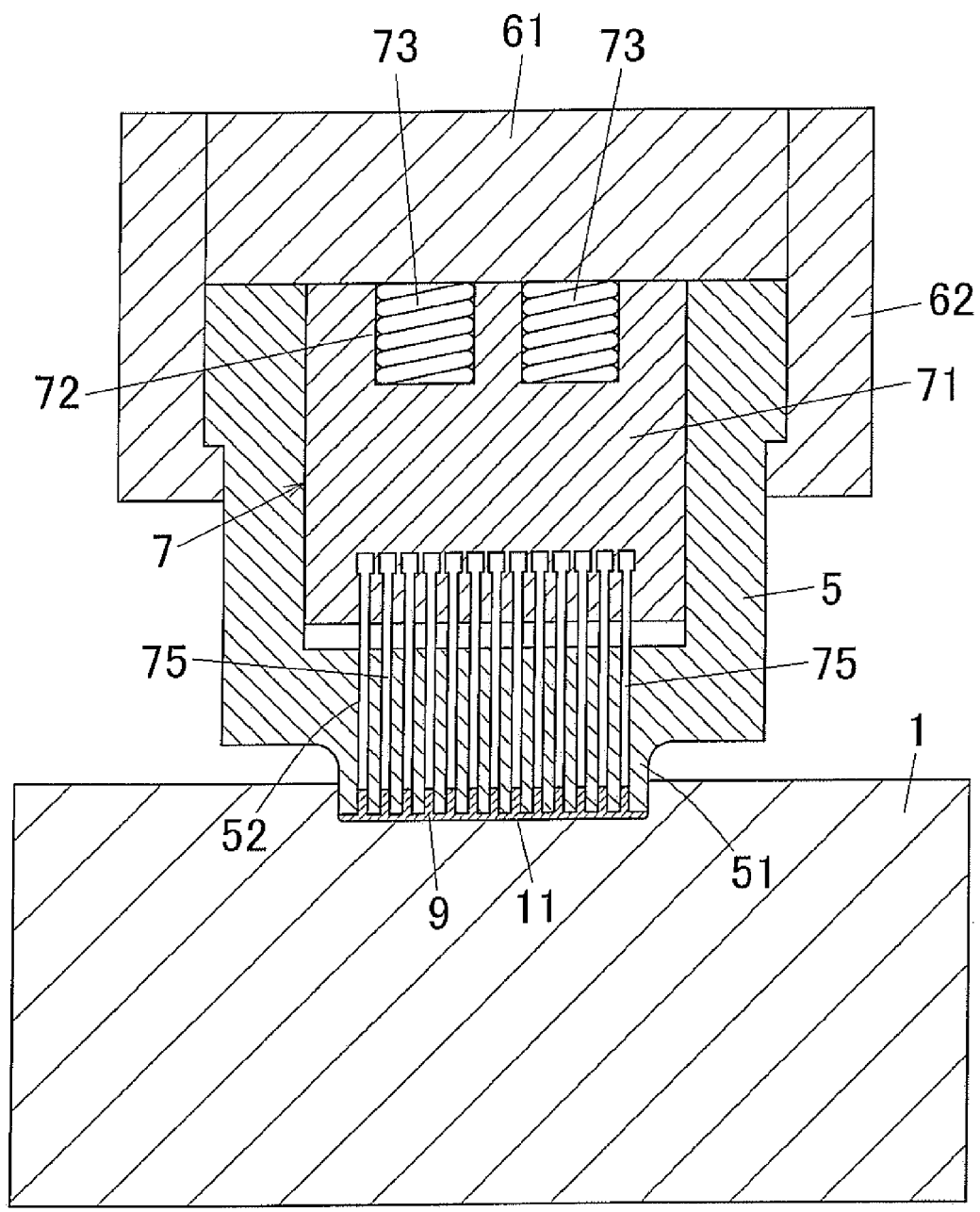
FIG. 2 is a schematic front cross-sectional view showing a forging device of the embodiment in which the punch is in a descended state.

FIGS. 1 and 2 are schematic front cross-sectional views showing an example of a forging device according to an embodiment of the present invention. In this embodiment, using the forging device shown in these figures, a forging blank W is formed into a heat sink 9 as a forged product.

Figure 5:
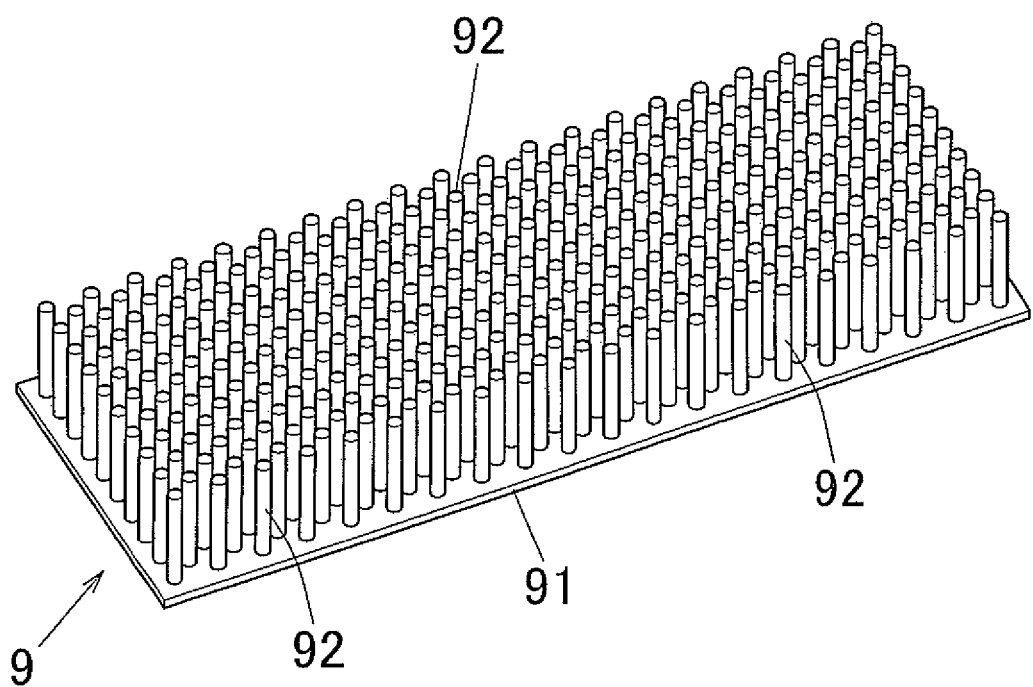
FIG. 5 is a perspective view showing a heat sink produced by the embodiment.

FIG. 5 is a perspective view showing an example of the heat sink 9 produced by the forging device of this embodiment. As shown in this figure, the heat sink 9 includes a rectangular base board 91 and a number of pin fins 92 formed on the upper surface of the base board 91. Each pin fin 92 is formed into a columnar shape round in horizontal cross-section, and integrally formed on the base board 91.

An aluminum alloy and a copper alloy are preferably used as a material of the heat sink 9.

In this embodiment, the direction of the heat sink 9 is determined by the position of the heat sink 9 in the die immediately after forming. Specifically, in this embodiment, the surface side of the heat sink 9 in which the pin fin 92 is formed is described as an upper surface.

As shown in FIGS. 1 and 2, the forging device of this embodiment is equipped with, as basic structural components, a die 1 as a lower die, a punch 5 as an upper die, a punch holder 62 for holding the punch 5, and a back pressure applying mechanism 7 for applying a back pressure.

A forming dented portion 11 for forming a base board 91 of the heat sink 9 is formed on the upper surface of the die 1.

In the bottom wall portion of the forming dented portion 11 of the die 1, a knockout pin (not illustrated) is accommodated in an upwardly protrudable manner from the bottom surface of the forming dented portion 11. As explained later, the heat sink 9 formed in the forming dented portion 11 of the die 1 is knocked up by the knockout pin so that the heat sink 9 is pushed up by a small amount from the forming dented portion 11.

The punch 5 is formed into a cylindrical shape having a lower closed bottom end, and a punch main body 51 corresponding to the forming dented portion 11 of the die 1 is formed on the bottom wall portion.

A plurality of fin-forming holes 52 for forming pin fins 92 of the heat sink 9 as a forged product are formed in the punch main body 51. Each fin-forming hole 52 is penetrated in the up and down direction with the upper end open to the interior space of the punch 5 and the lower end open to the lower part of the punch. Furthermore, the horizontal cross-sectional shape of each fin-forming hole 52 is a circle corresponding to the horizontal cross-sectional shape of the pin fin 92.

A punch plate 61 is arranged on the upper end face of the punch 5 so as to close the upper end opening of the punch 5. In this state, the punch 5 and the punch plate 61 are held by the punch holder 62.

The punch holder 62 is supported by a guide post, etc. (not illustrated) in a freely hoistable manner, so that the punch 5 is configured to be approached to and detached from (hoisted) the die 1 together with the punch holder 62 with the axial center of the punch 5 aligned with the axial center of the forming dented portion 11 of the die 1.

Furthermore, the punch holder 62 is configured to be hoisted by a hoist drive mechanism (not illustrated). As shown in FIG. 1, in a state in which the punch 5 is arranged above the die 1, when the punch 5 is descended together with the punch holder 62 by the hoist drive mechanism, as shown in FIG. 2, the main body 51 of the punch 5 is punched into the forming dented portion 11 of the die 1.

The punch 5 is provided with a back pressure applying mechanism 7. This back pressure applying mechanism 7 includes a spring holder 71 accommodated in the interior space of the punch 5.

The spring holder 71 is supported in the interior space of the punch 5 in a freely slidable manner in the up and down direction (along the axial center).

Furthermore, a plurality of spring accommodating dented portions 72 are formed on the upper end face side of the spring holder 71, and springs 73 as biasing mechanisms, made of compression coil springs, etc., are accommodated in respective spring accommodating dented portions 72. The upper end of each spring 73 is joined to the punch plate 61 in a compressed state and the bottom end of each spring 73 is joined to the bottom surface of the spring accommodating dented portion 72. Therefore, in a state in which the punch 5 is in an elevated state (normal state), the spring holder 71 is pushed downward by its own weight and the biasing force of the spring 73, and thereby disposed in a state in which it contacts the bottom wall portion of the punch 5 (punch main body 51).

Further, in the back pressure applying mechanism 7, back pressure applying pins 75 are provided, corresponding to respective fin-forming holes 52 of the punch 5. The horizontal cross-sectional shape of each back pressure applying pin 75 is formed into a circular shape corresponding to the horizontal cross-sectional shape of each fin-forming hole 52. The back pressure applying pin 75 is also called an injector pin.

Each back pressure applying pin 75 is accommodated in the corresponding fin-forming hole 52 in a freely slidable manner in the axial direction (up and down direction), in a state in which the upper end portion of each back pressure applying pin 75 is fixed to the lower side portion of the spring holder 71. In this way, each back pressure applying pin 75 slides up and down in each fin-forming hole 52 in accordance with the hoisting movements of the spring holder 71.

The lower end face (restraining tip end face) of each back pressure applying pin 75 is, as shown in FIG. 1, in a state in which the spring holder 71 is disposed at a lower end position (in a state in which the punch 5 is elevated), arranged corresponding to the lower end opening portion of each fin-forming hole 52, that is, the forming face of the punch main body 51.

Figure 4:
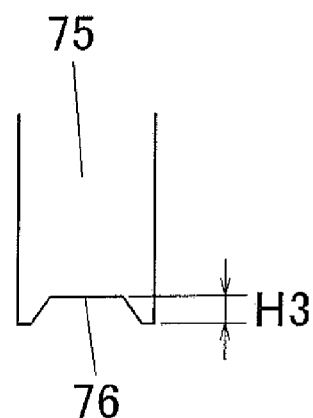
FIG. 4 is a cross-sectional view showing a tip end of a back pressure applying pin applied to the forging device of the embodiment.

In one example of this embodiment as shown in FIG. 4, at the center of the restraining tip end face of each back pressure applying pin 75, a concave portion 76, having a trapezoidal front cross-sectional shape and a conical trapezoid shape as a whole, is formed.

In this embodiment, the "center" in the context that the concave portion 76 is formed at the center of the restraining tip end face of the back pressure applying pin 75 refers to a position where the concave portion 76 does not come into contact with the outline of the restraining tip end face. Specifically in this embodiment, looking at the back pressure applying pin 75 from the tip end side (lower side) in the axial direction, the concave portion 76 is preferably formed in an area inside the outline of the back pressure applying pin 75 that is within 90% range of the area having the axial center of the back pressure applying pin 75 as the center.

In this embodiment, it is preferable that the axial center of the concave portion 76 formed at the tip end of the back pressure applying pin is aligned with the axial center of the back pressure applying pin 75.

Next, the procedures for producing the heat sink 9 as a forged product using the forging device having the aforementioned structure will be explained.

As shown in FIG. 1, lubricant is applied to necessary portions of the die 1 and the punch 5, and a plate-shaped forging blank W is set in the forming dented portion 11. The forging blank W, the die 1, and the punch 5 are pre-heated as needed.

Figure 3:
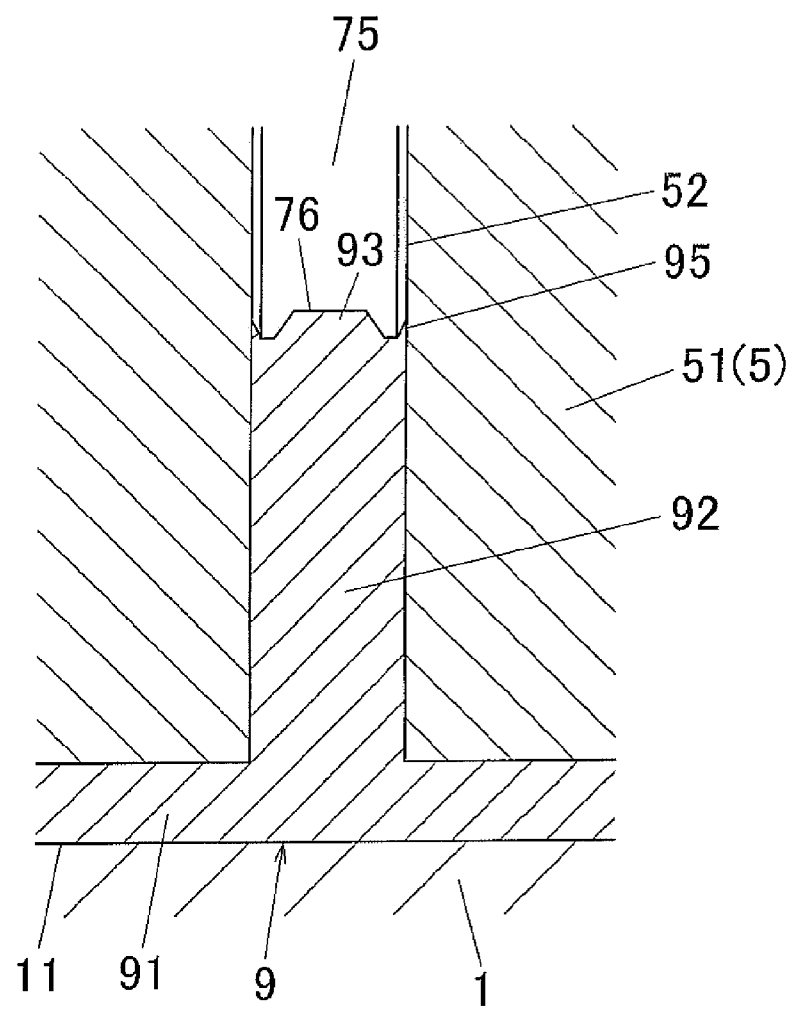
FIG. 3 is a front cross-sectional view showing the vicinity of the fin-forming hole of the forging device of the embodiment in which the punch is in a descended state.

From this state, as shown in FIG. 2, the punch 5 is descended to punch the punch main body 51 into the forming dented portion 11 of the die 1. As a result, as shown in FIG. 3, a compressive load is applied to the forging blank W. By the compressive load, the metal material (metal) constituting the forging blank W is plastically flowed, and flows into each fin-forming hole 52 of the punch main body 51 while pushing each back pressure applying pin 75 upward against the own weight of the back pressure applying mechanism 7 and the biasing force of the spring 73.

Here, for the metal material flowing into each fin-forming hole 52, the own weight of the back pressure applying mechanism 7 and the biasing force of the springs 73 function as a back pressure (resistance force) in the opposite direction of the flowing direction. Therefore, the metal material can be evenly flowed into each fin-forming hole 52 in a well-balanced manner.

A base board 91 is formed by the metal material filled in a forming space surrounded by the inner peripheral surface of the forming dented portion 11 of the die 1 and the forming surface (lower end surface) of the punch main body 51, and pin fins 92 are formed by the metal material filled in the forming space surrounded by the restraining tip end face of the back pressure applying pin 75 and the inner peripheral surface of the fin-forming hole 52. Consequently, as shown in FIGS. 5 and 6A, a heat sink 9 as a forged product in which a plurality of pin fins 92 are integrally formed on the upper surface of the base board 91 is formed.

Figure 6A:
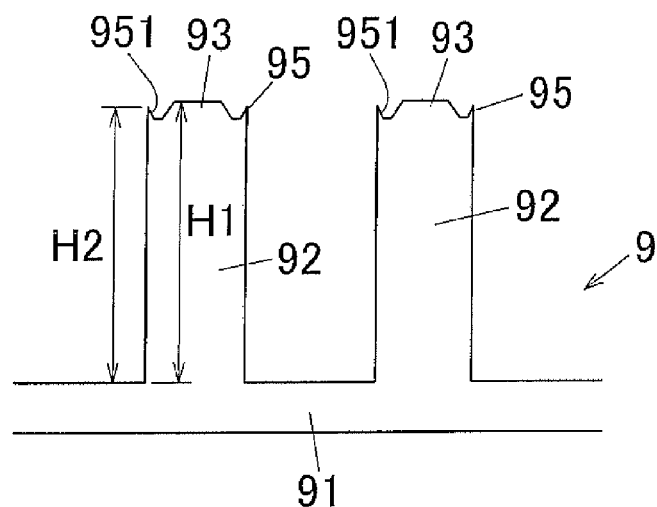
FIG. 6A is a cross-sectional view showing the heat sink produced by the embodiment.

Also, as shown in FIGS. 3, 4, and 6A, in this embodiment, since the concave portion 76 is formed at the center of the restraining tip end face of the back pressure applying pin 75, the concave portion 76 is also filled by the metal material. Therefore, by the metal material filled in the concave portion 76, a conical trapezoid shaped joining convex portion 93 is integrally formed at the tip end center of the pin fin 92 of the heat sink as a forged product.

In this embodiment, the "center" in the context that the joining convex portion 93 is formed at the tip end center of the pin fin 92 refers to a position where the joining convex portion 93 does not come into contact with the outline of the tip end of the pin fin. Specifically in this embodiment, looking at the pin fin 92 from the tip end side (upper side) in the axial direction, the joining convex portion 93 is formed in an area inside the outline of the pin fin 92 that is within 90% range of the area having the axial center of the pin fin 92 as the center.

As shown in FIGS. 3 and 6A, a clearance (gap) is formed between the inner peripheral surface of the fin-forming hole 52 of the punch main body 51 and the outer peripheral surface of the back pressure applying pin 75. Therefore, at the time of the forming processing, the metal material also enters the gap. As a result, a crown shaped burrs 95 are formed at the tip end outer peripheral edge of the pin fin 92 of the heat sink 9.

In this embodiment, a thin protruded portion is constituted by the burrs 95. In the present invention, there is a case in which the thin protruded portion is constituted by an excess portion such as the burrs 95, but the thin protruded portion can also be constituted by an intentionally formed portion as explained later.

After the heat sink 9 is formed in this way, the punch 5 is elevated. Consequently, a knockout pin (not illustrated) is protruded upward from the bottom portion of the forming dented portion 11 of the die 1. By the knockout pin, the heat sink 9 is knocked up in the forming dented portion 11 and arranged in an upwardly pushed up manner.

After discharging the knocked up heat sink 9 to a predetermined place, a new forging blank W is set in the forming dented portion 11 of the die 1.

Then, the new forging blank W is subjected to forging in the same manner as described above to form a heat sink 9. These operations are repeated to sequentially produce heat sinks 9 as forged products.

In the heat sink 9 produced in the aforementioned manner, it can be assumed that the heat sink 9 is used by attaching a plate, e.g., a heat transfer plate such as a metal plate that covers and seals an entire area or a predetermined area of the pin fin side 92.

Figure 6B:
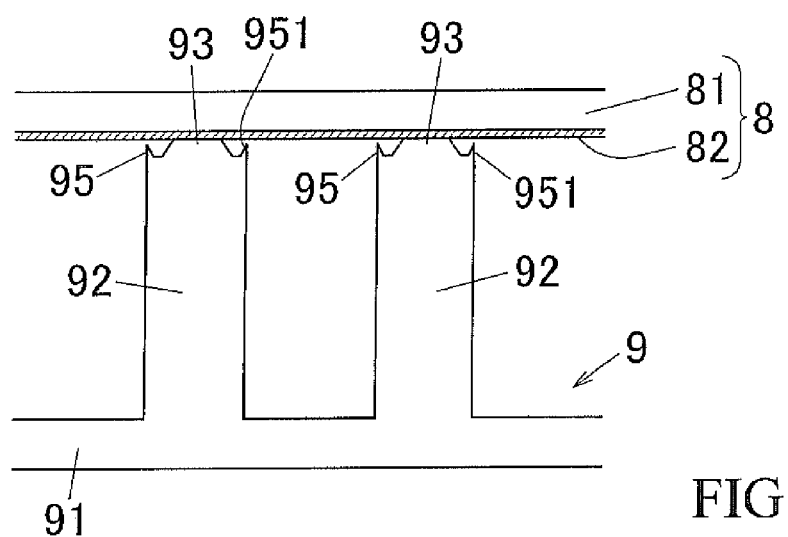
FIG. 6B is a cross-sectional view showing the heat sink produced by the embodiment in a state in which a blazing sheet is arranged on the heat sink.

In the case of attaching a metal plate to the heat sink 9, as shown in FIG. 6B for example, a brazing sheet 8 which is a composite plate in which a brazing material 82 made of an aluminum alloy, etc., is laminated on the lower surface of the metal plate 81, is prepared. Then, the brazing sheet 8 is arranged so that the brazing material 82 side of the brazing sheet 8 comes into contact with the tip end of each pin fin 92 of the heat sink 9. In this state, the brazing sheet 8 is heated while being pressed toward the heat sink 9 to melt the brazing material 82.

Figure 6C:
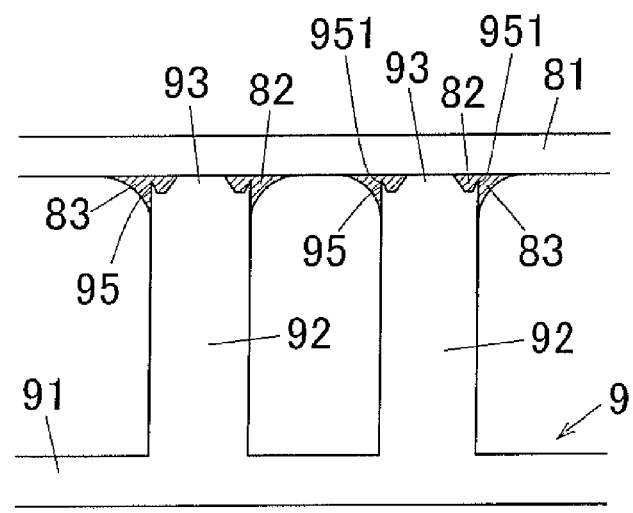
FIG. 6C is a cross-sectional view showing the heat sink produced by the embodiment in a state in which a metal plate is attached.

As a result, as shown in FIG. 6C, the melted brazing material 82 fills the gap between the tip end portion of the pin fin 92 and the lower surface of the metal plate 81. Furthermore, a fillet 83 made of the flowed brazing material 82 is formed between the tip end outer periphery of the pin fin 92 and the lower surface of the metal plate 81.

In this way, a heat sink having a metal plate in which the metal plate 81 is fixedly joined to the tip end of each pin fin 92 of the heat sink 9 via the brazing material 82 is assembled.

In the heat sink 9 having a metal plate (heat sink having a heat transfer plate), for example, a heat generation member, such as, e.g., a power transistor, is attached to the upper surface of the metal plate 81. The heat generated by the heat generation member is transmitted to a heat transfer medium between the metal plate 81 and the base board 91 via the metal plate 81 and the pin fins 92 to decrease the temperature of the heat generation member. The heat transfer medium includes air as well as a refrigerant.

As shown in FIGS. 3 and 4, a forging device in which the back pressure applying pin 75 having a concave portion 76 formed at the center of the restraining tip end face is accommodated in the fin-forming hole 52 of the punch main body 51. For this reason, the metal plate 81 can be fixedly joined to the tip end of each pin fin 92 of the produced heat sink 9 in a good state.

Figure 13:
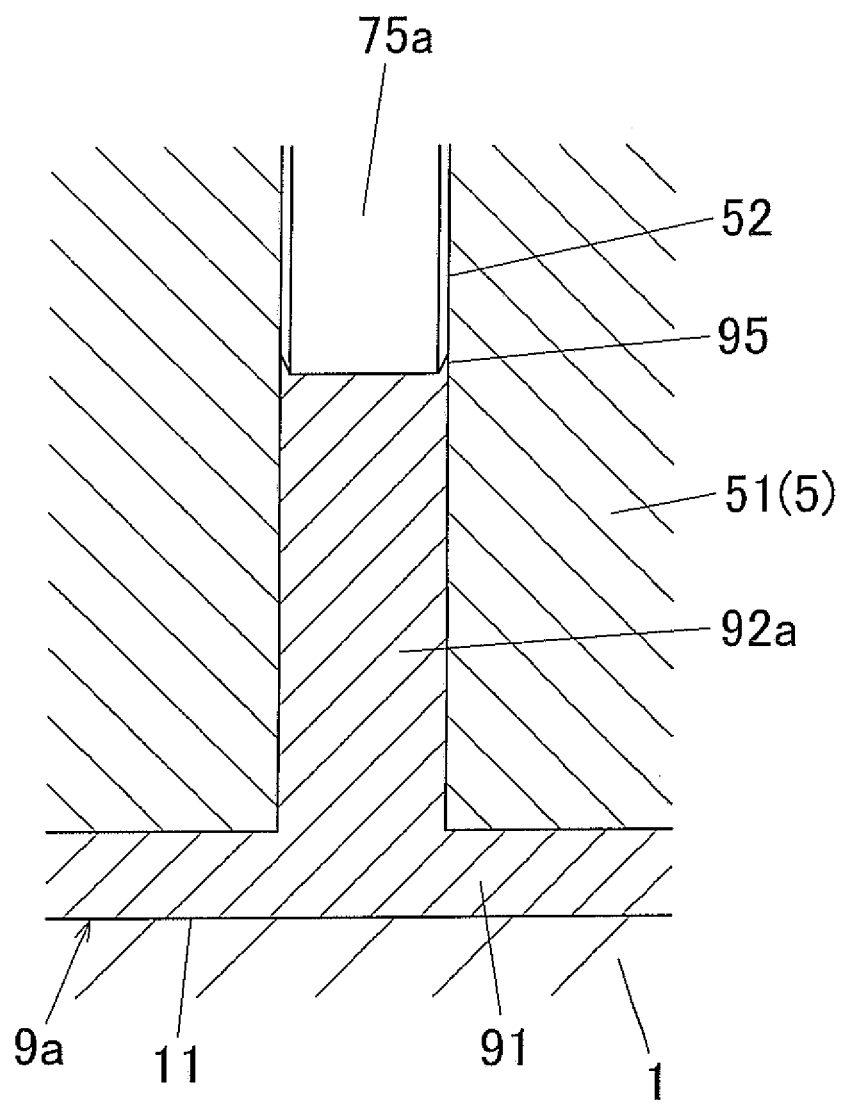
FIG. 13 is a front cross-sectional view showing the vicinity of the fin-forming hole of the forging device as a referential embodiment in which the punch is in a descended state.
Figure 14A:
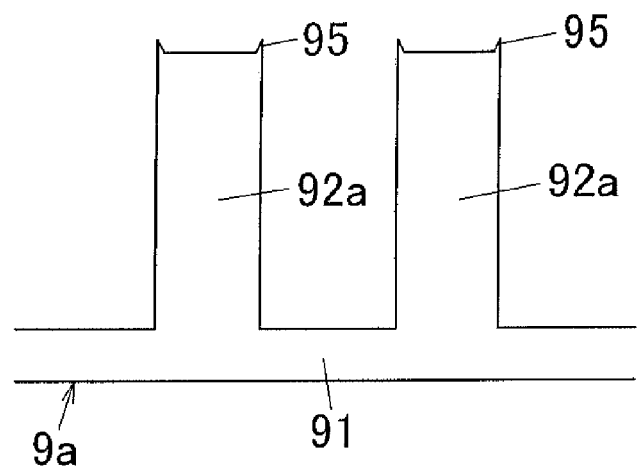
FIG. 14A is a cross-sectional view showing a heat sink produced using the referential embodiment.

As shown in the referential embodiment of FIG. 13, in a heat sink 9a produced using a forging device in which a back pressure applying pin 75a having a flat restraining tip end face is accommodated in a fin-forming hole 52 of a punch main body 51, only burrs 95 are formed on the outer peripheral edge of the tip end face of a pin fin 92a so as to protrude toward the tip end side (upward) as shown in FIG. 14A.

Figure 14B:
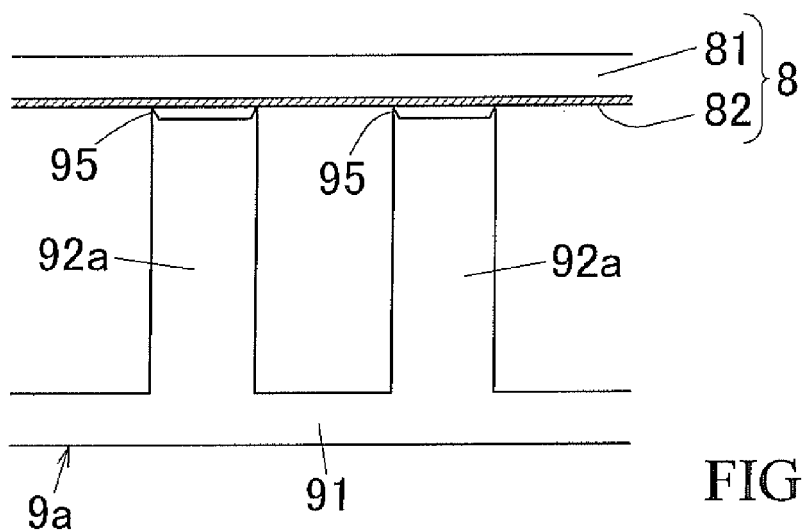
FIG. 14B is a cross-sectional view showing a heat sink produced by the referential embodiment in a state in which a blazing sheet is arranged on the heat sink.
Figure 14C:
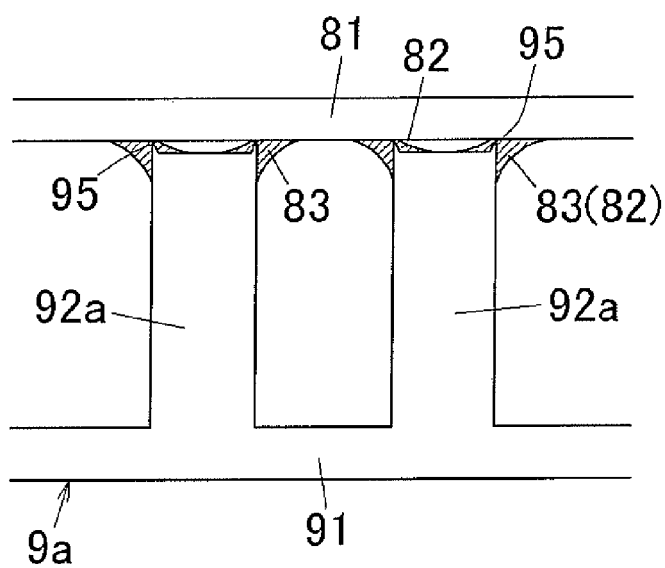
FIG. 14C is a cross-sectional view showing a heat sink produced by the referential embodiment in a state in which a metal plate is joined.

In a state in which the burrs 95 are protruded upward than the tip end of the pin fin 92a, as shown in FIG. 14B, if the brazing sheet 82 is arranged so as to come into contact with the tip end of each pin fin 92a, pressed and heated to melt the brazing material 82, the melted brazing material 82 does not sufficiently fill the gap between the tip end face of the pin fin 92a and the metal plate 81 since the burrs 95 are interposed between the tip end face of the pin fin 92a and the metal plate 81. As a result, as shown in FIG. 14C, a large gap portion (non-joined portion) not filled by the brazing material 82 is formed between the tip end of the pin fin 92a and the metal plate 81. This deteriorates the thermal conductivity from the metal plate 81 to the pin fin 92a due to the poor joining, resulting in a deteriorated heat radiation performance.

After producing the heat sink 9a but before joining the metal plate 81, if burrs 95 formed at the tip end outer peripheral edge of the pin fin 92a are removed by, e.g., cutting or shot blasting, it becomes possible to fixedly join the metal plate 81 to the tip end of the pin fin 92a in an excellent state. In doing so, however, it is required to perform low efficiency machining to remove the burrs 95, resulting in a deteriorated production efficiency by that.

On the other hand, in the forging device of this embodiment, as shown in FIGS. 3 and 4, since the back pressure applying pin 75 in which the concave portion 76 is formed at the center of the restraining tip end face, a joining convex portion 93 protruding toward the tip end side (upward) is formed at the tip end center of the pin fin 92 of the produced heat sink 9. Therefore, as shown in FIGS. 6B and 6C, when the brazing material 82 of the brazing sheet 8 melts, with the tip end face of the joining convex portion 93 and the metal plate 81 in direct contact with each other, the brazing material 82 sufficiently fills between the outer peripheral portion of the joining convex portion 93 and the metal plate 81 and flows to the tip end outer peripheral portion of the pin fin 92 to form the fillet 83. In this way, the tip end portion of each pin fin 92 and the lower surface of the metal plate 81 are fixedly joined directly or via the brazing material 82 without a gap. Therefore, heat transfer from the metal plate 81 to the pin fin 92 can be performed smoothly, and therefore excellent heat radiation performance can be obtained.

In this embodiment, as shown in FIG. 6A, in order for the tip end of the joining convex portion 93 formed at the tip end center of the pin fin 92 to come into direct contact with the metal plate 81, it is preferred that the height H1 of the joining convex portion 93 is set to be the same as the height H2 of the burrs 95 or higher than the height H2 of the burrs 95. In this case, the brazing material 82 sufficiently fills the gap between the peripheral portion of the joining convex portion 93 of the pin fin 92 and the metal plate 81, and therefore almost the entire area of the tip end of each pin fin 92 and the metal plate 81 can be fixedly joined directly or via the brazing material 82. In the present invention, the height H1 of the joining convex portion 93 is preferred to be higher than the height H2 of the burrs 95 rather than the same as the height H2 of the burrs 95.

Therefore, in the present invention, it is preferable that the shape and the size of the concave portion 76 of the restraining tip end face of the back pressure applying pin 75 of the forging device is determined so that the height H1 of the joining convex portion 93 from the upper surface of the base board is the same as the height H2 of the burrs 95 from the upper surface of the base board or higher than the height H2 of the burrs 95.

In the present invention, however, it is not always necessary to form the joining convex portion 93 so that the height H1 of the joining convex portion 93 is higher than the height H2 of the burrs 95. That is, even if the height H1 of the joining convex portion 93 is lower than the height H2 of the burrs 95, if the joining convex portion 93 is formed at the tip end of the pin fin 92, the brazing material 82 can easily fill the gap between the joining convex portion 93 and the metal plate 81. Therefore, the tip end of the pin fin 92 and the metal plate 81 can be fixedly joined via the brazing material 82 without a gap and a predetermined heat radiation performance can be obtained.

Figure 6D:
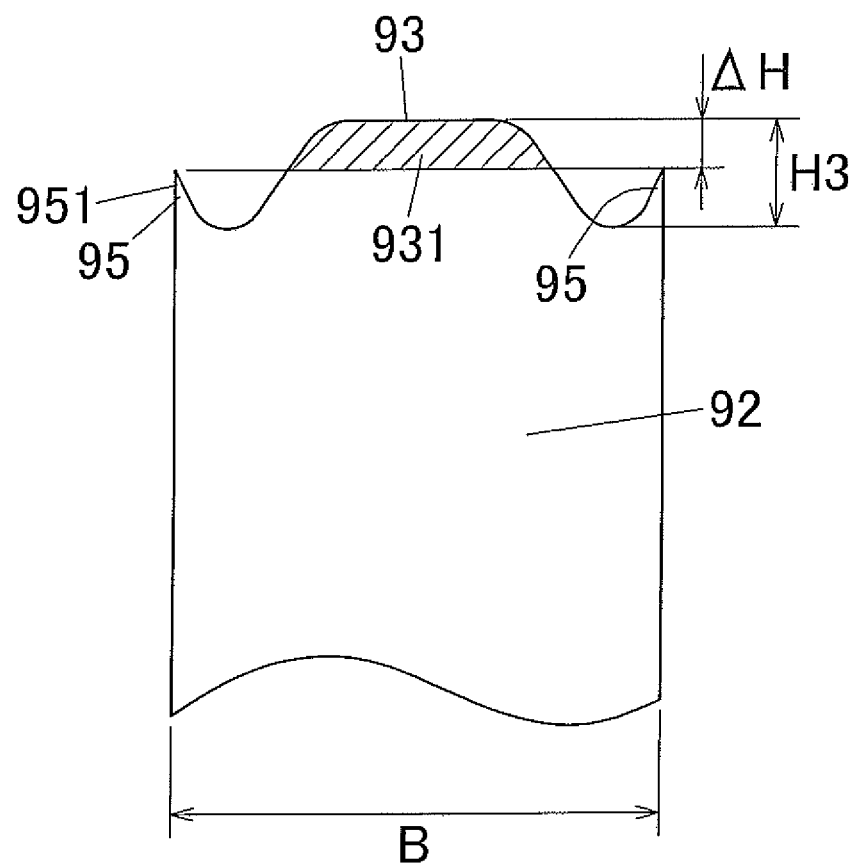
FIG. 6D is an enlarged cross-sectional view of the tip end portion of the pin fin of the heat sink according to the embodiment.

FIG. 6D is an enlarged cross-sectional view showing the tip end portion of the pin fin 92 of the heat sink 9 of this embodiment. In this embodiment as shown in this figure, it is preferable to satisfy a relational expression of $0.001 \leq H3/B \leq 4$, where the height of the convex portion 93 is "H3" and the outer diameter (diameter) of the pin fin 92 is "B". That is, it becomes possible to attain excellent joining by satisfying the relational expression.

Further, in this embodiment, since the joining convex portion 93 is formed at the center of the tip end portion of the pin fin 92, the center of each pin fin 92 can be assuredly brought into contact with the metal plate 81. As a result, the pin fin 92 and the metal plate 81 can be fixedly joined in a better condition.

Further, in this embodiment, since the tip end of the joining convex portion 93 is formed into a flat surface, a large contact area can be secured between the joining convex portion 93 and the metal plate 81. As a result, the joining convex portion 93 and the metal plate 81 can be fixedly joined in an even better condition.

Also, in this embodiment, as previously explained, the metal plate 81 can be fixedly joined to the forged heat sink 9 in an excellent state without removing the burrs 95. Therefore, the step of removing the burrs 95 is not needed, and the number of working steps can be reduced, thereby improving the production efficiency.

In this embodiment, it should be noted that the joining method of the heat sink 9 and the metal plate 81 is not limited to brazing. In the present invention, even in the case of employing a joining method other than brazing, an excellent joined condition can be obtained in the same manner as mentioned above.

Figure 7A:
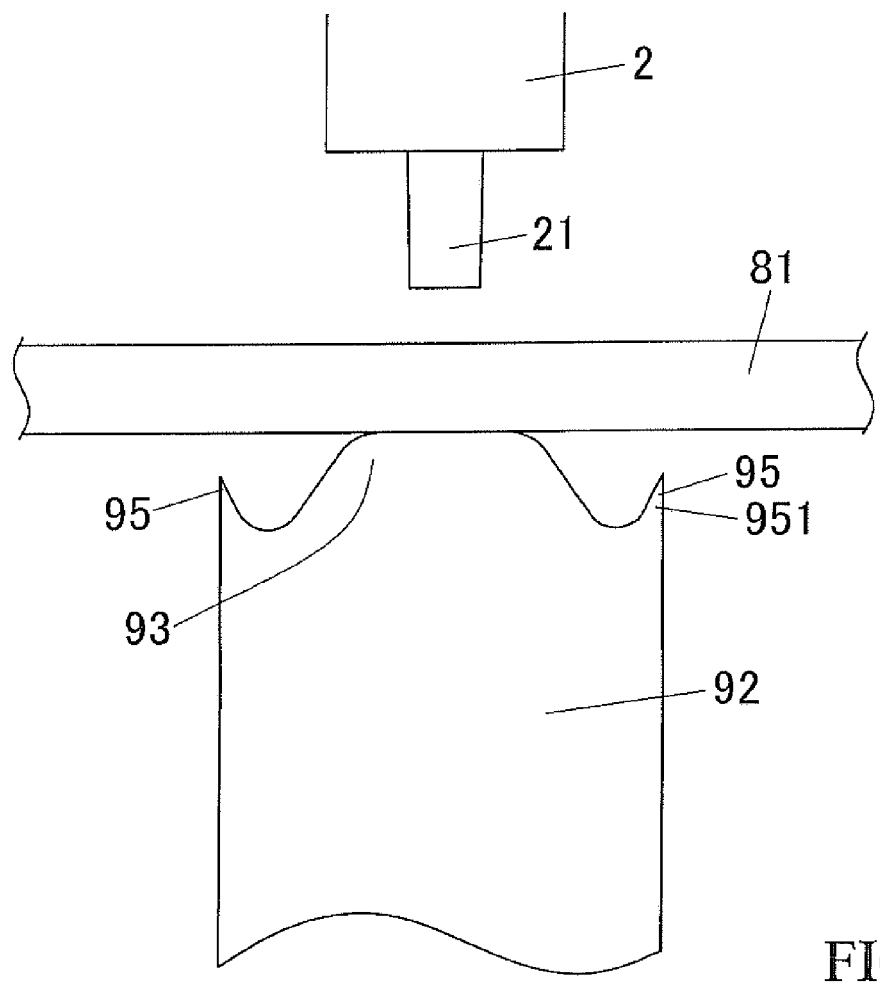
FIG. 7A is a cross-sectional view showing a state immediately before joining the heat sink of the embodiment to a metal plate by friction stir welding.
Figure 7B:
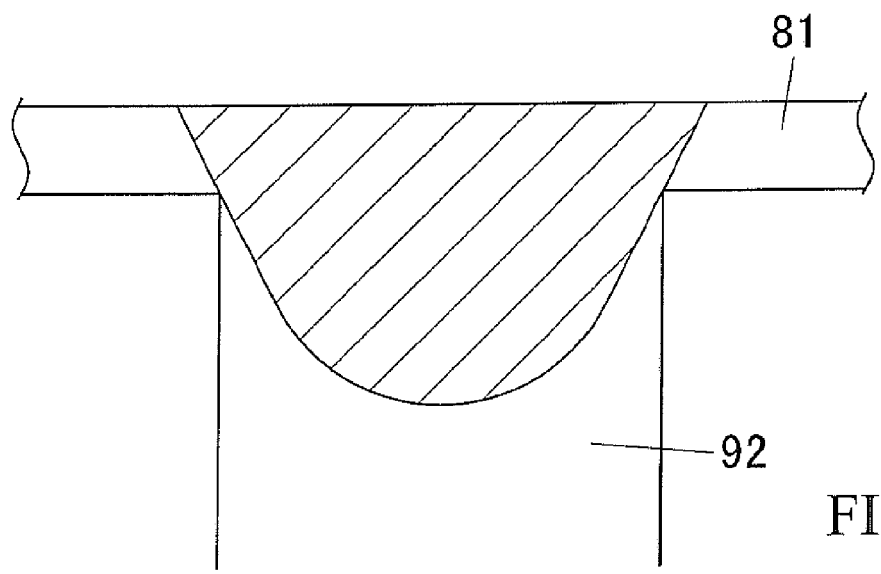
FIG. 7B is a cross-sectional view showing a state after joining the heat sink of the embodiment to the metal plate by friction stir welding.

For example, in the present invention, even in the case of joining the heat sink 9 and the metal plate 81 by friction stir welding (FSW), an excellent joined state can be obtained in the same manner as mentioned above. That is, as shown in FIG. 7A, in the heat sink 9 of this embodiment, since the joining convex portion 93 is formed at the tip end of the pin fin 92, almost no gap is formed between the pin fin 92 and the metal plate 81 at the butted portion of the pin fin 92 to the metal plate 81. Therefore, when a probe 21 of a joining tool 2 for friction stir welding is inserted into the tip end portion of the pin fin 92 from the metal plate 81 side, the metal material of the pin fin 92 in the vicinity of the inserted portion and the metal material of the metal plate 81 are stirred. Consequently, as shown in FIG. 7B, the metal material fills the space between the pin fin 92 and the metal plate 81 without a gap between the pin fin 92 and the metal plate 81, and thus both members are integrally joined. In FIG. 7B, the portion in which the metal material was stirred during the friction stir welding is shown by hatching.

Since the space between the pin fin 92 of the heat sink 9 and the metal plate 81 can be filled by the metal material without a gap, the heat sink 9 and the metal plate 81 can be joined in an excellent condition.

Figure 15:
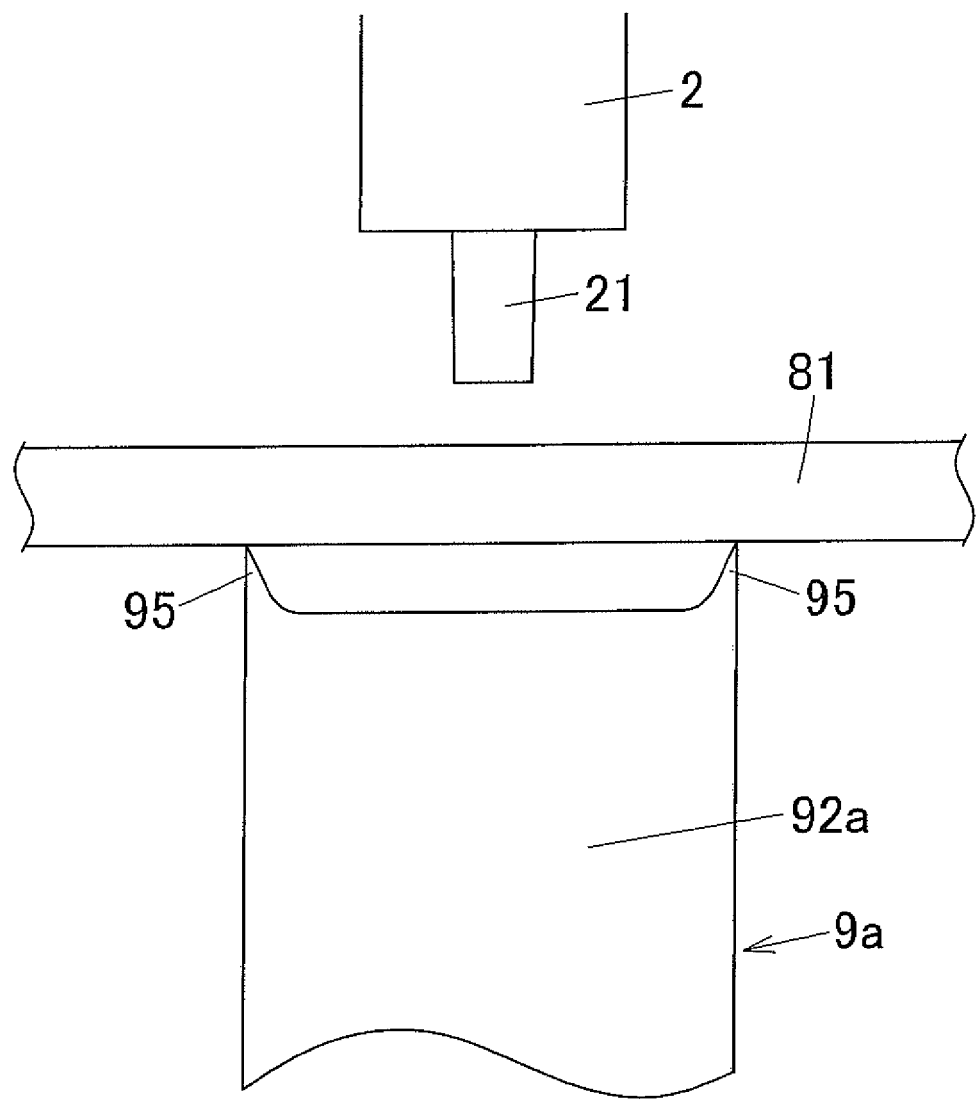
FIG. 15 is a cross-sectional view showing a state immediately before joining a heat sink of the referential embodiment to a metal plate by friction stir welding.

On the other hand, in a heat sink 9a corresponding to a conventional embodiment as shown in FIG. 15, since only burrs 95 are formed on the top end outer peripheral edge of the pin fin 92a, when the tip end of the pin fin 92a is butted to the metal plate 81, a large gap is formed between the pin fin 92a and the metal plate 81. When such a large gap is formed, a sufficient amount of metal material will not be filled between the pin fin 92a and the metal plate 81 even if friction stir welding is performed. Therefore, the heat transfer rate between the metal plate 81 and the pin fin 92a was poor, and it was difficult to join the heat sink 9 and the metal plate 81 in an excellent condition.

Figure 8A:
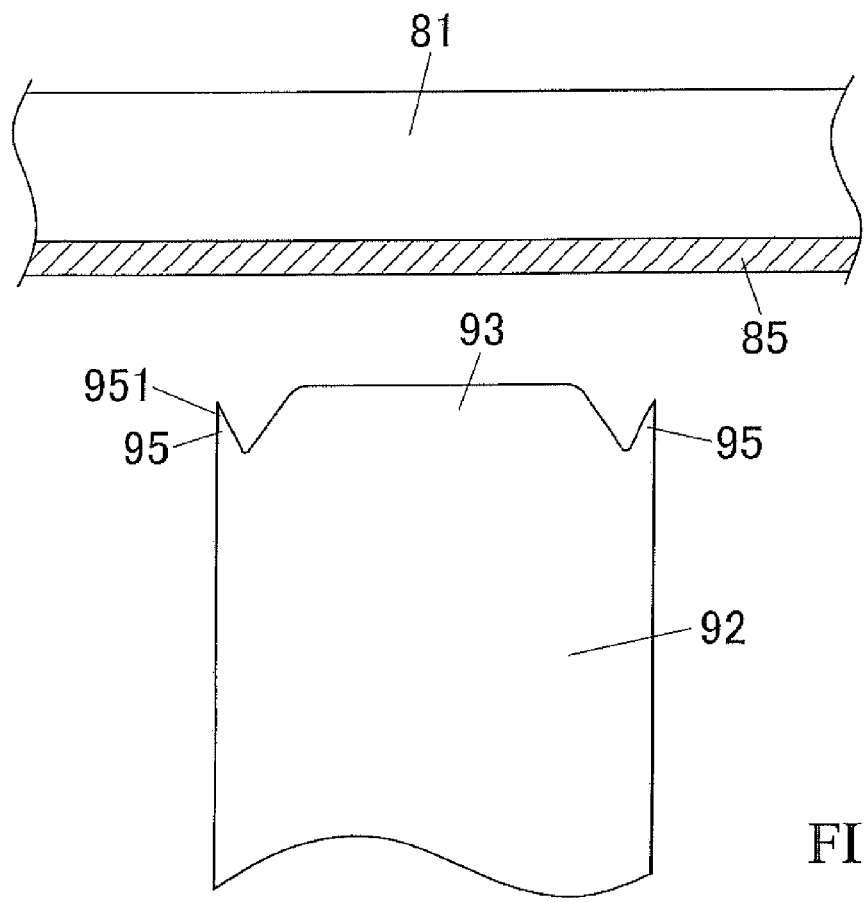
FIG. 8A is a cross-sectional view showing a state immediately before joining the heat sink of the embodiment to a metal plate by an adhesive agent.
Figure 8B:
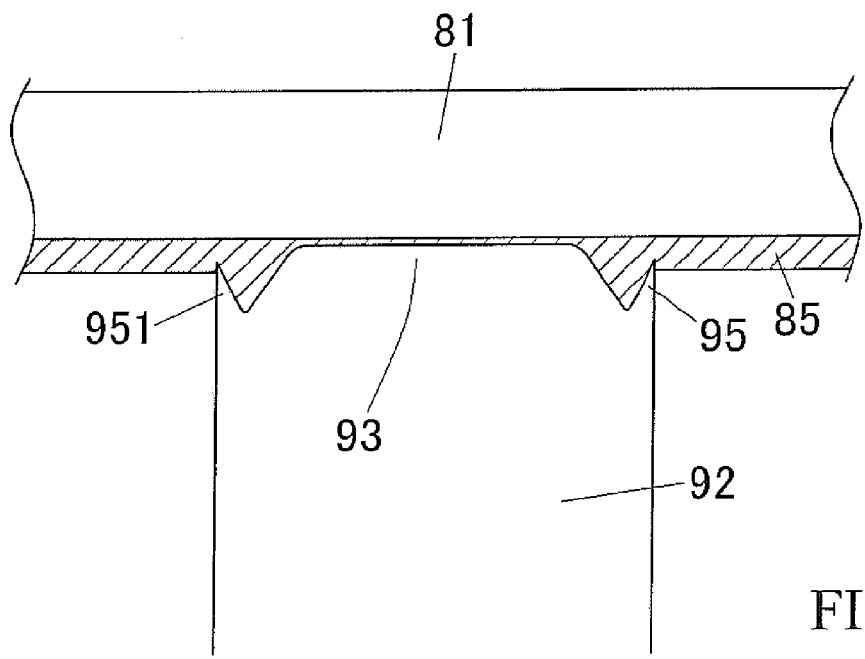
FIG. 8B is a cross-sectional view showing a state after joining the heat sink of the embodiment to the metal plate by an adhesive agent.

Further, in the present invention, the heat sink 9 and the metal plate 81 can be joined by an adhesive agent. For example, as shown in FIG. 8A, an adhesive layer 85 is provided on the joining surface of the metal plate 81 to the heat sink 9. The adhesive layer 85 is formed by laminating an adhesive agent having good thermal conductivity or pasting an adhesive sheet containing an adhesive agent having good thermal conductivity. Then, as shown in FIG. 8B, the pin fin 92 of the heat sink 9 is pressed and brought in contact with the adhesive layer 85 of the metal plate 81 to thereby join the pin fin 92 and the metal plate 81 via an adhesive agent. In the present invention, a pressure-sensitive adhesive is included in the adhesive agent.

When joining them using an adhesive agent as mentioned above, in this embodiment, the heat sink 9 and the metal plate 81 can be joined in an excellent condition. That is, as shown in FIG. 8A, in the heat sink 9 of the present invention, since the joining convex portion 93 is formed at the tip end of the pin fin 92, almost no gap is formed between the pin fin 92 and the metal plate 81 at the butted portion of the pin fin 92 to the metal plate 81. Therefore, as shown in FIG. 8B, the adhesive agent fills the space between the pin fin 92 and the metal plate 81 without a gap, and the pin fin 92 and the metal plate 81 can be joined in an excellent condition.

Furthermore, since an adhesive agent has a lower thermal conductivity in comparison to metals such as brazing materials, it is preferable that the adhesive layer 85 is thinly formed.

In a conventional heat sink 9a as shown in FIG. 15, since a large gap is formed between the pin fin 92a and the metal plate 81, the space between the pin fin 92a and the metal plate 81 cannot be assuredly filled by an adhesive agent. Therefore, even in the case of using an adhesive agent, it is difficult to join the heat sink 9 and the metal plate 81 in an excellent state.

As explained above, in the heat sink 9 of the present invention, the heat sink 9 and the metal plate 81 can be joined in an excellent condition by any joining method, such as, e.g., brazing, friction stir welding, or joining by an adhesive agent.

On the other hand, in this embodiment, in some cases, a correction step by pressing is conducted before fixedly joining the metal plate 81 to the heat sink 9 obtained by forging to match the heights of pin fins 92. In this case, as shown in FIG. 6A, it is preferable that the height H1 of the joining convex portion 93 of the pin fin 92 is formed higher than the height H2 of the burrs 95. And as shown in FIG. 6D, correction by pressing is performed so as to correct the tip end convex portion 931 which is a portion (portion to be pressed) higher than the burrs 95 at the tip end portion of the joining convex portion 93. In FIG. 6D, the portion corresponding to the tip end convex portion 931 is shown by hatching for an easy understanding of the present invention.

Figure 9A:
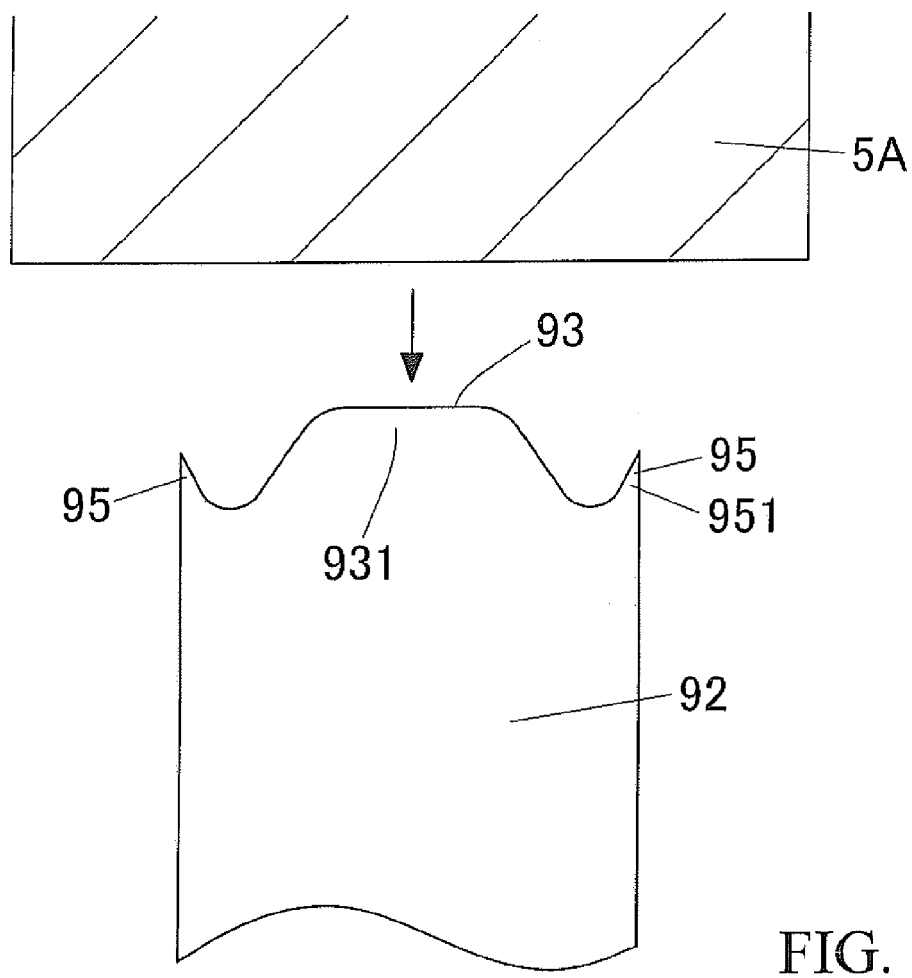
FIG. 9A is a cross-sectional view showing a state immediately before correcting the heat sink of the embodiment by press working.
Figure 9B:
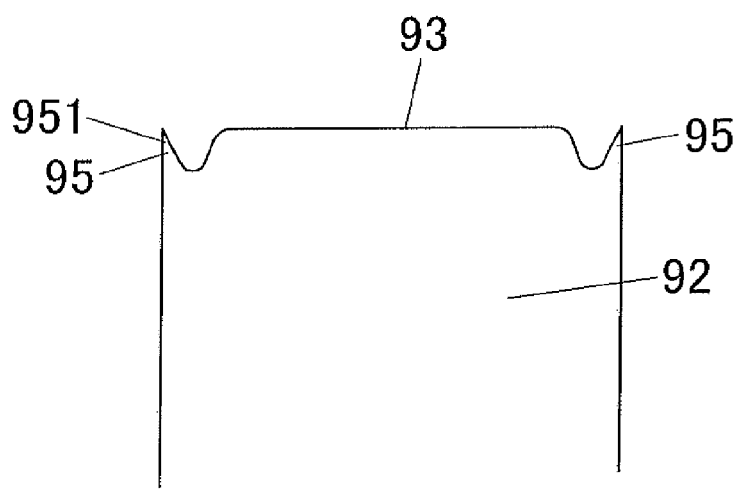
FIG. 9B is a cross-sectional view showing a state after correcting the heat sink of the embodiment by press working.

In this correction step, as shown in FIG. 9A, the tip end convex portion 931 of each pin fin 92 of the heat sink 9 is subjected to press working by a correction punch 5A in which the tip end thereof as a pressing surface is flat. With this, as shown in FIG. 9B, the joining convex portion 93 of each pin fin 92 of the heat sink 9 is pressed downward, and thus the tip end convex portion 931 is formed into a flat shape. In this way, the protruding amount of the joining convex portions 93 of each pin fin 92 is adjusted to match the height of each joining convex portion 93. Thus, the height of each pin fin 92 of the heat sink 9 can be matched.

Then, the metal plate 81 is joined, by a brazing material, to the heat sink 9 to which the correction step by pressing was performed.

Figure 16A:
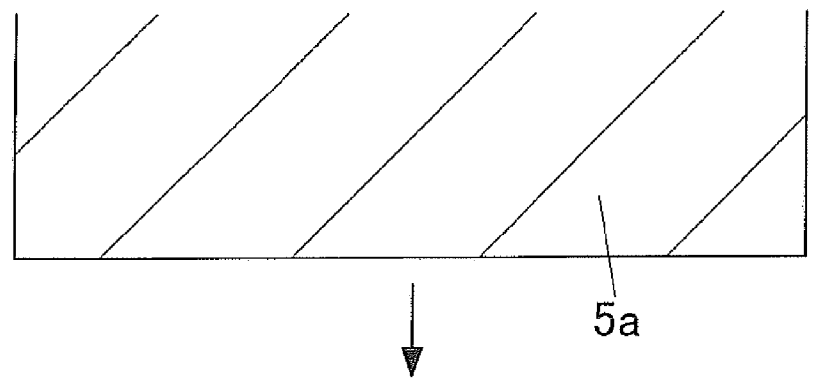
FIG. 16A is a cross-sectional view showing a state immediately before correcting a heat sink of the referential embodiment by press working.
Figure 16A:
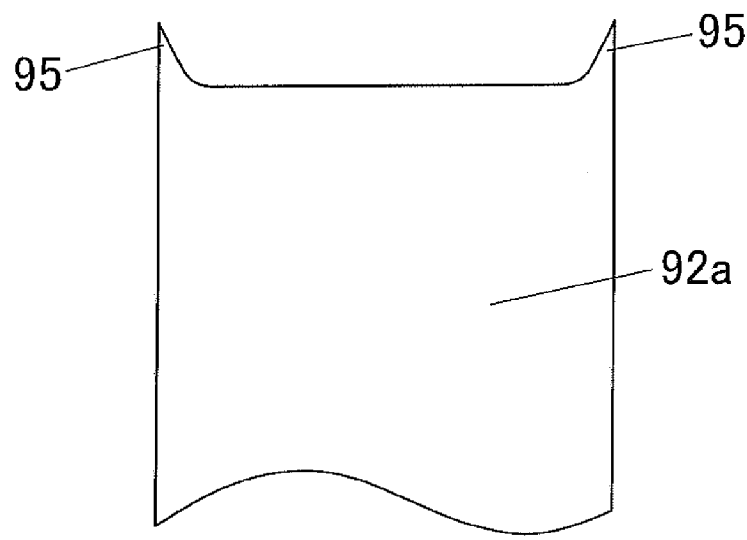

In the heat sink corresponding a conventional heat sink as shown in FIG. 16A, since only the burrs 95 are formed at the tip end of the pin fin 92a and no joining convex portion 93 is formed, it is difficult to assuredly join the metal plate 81 when the correction step by pressing is performed.

Figure 16B:
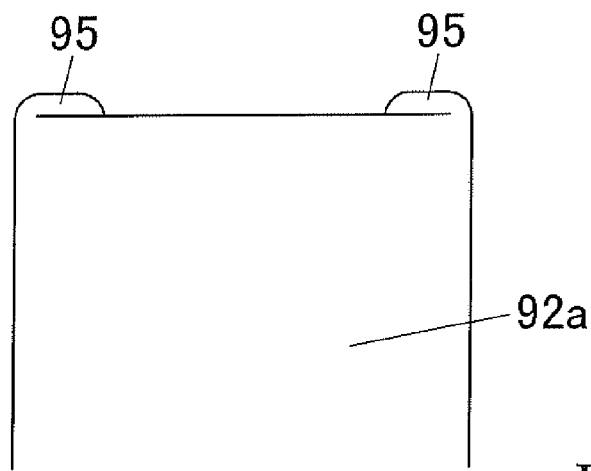
FIG. 16B is a cross-sectional view showing a state after correcting the heat sink of the referential embodiment by press working.

That is, as shown in FIG. 16A, if the tip end portion of the pin fin 92a is pressed by a correction punch 5a having a flat pressing surface, the burrs 95, as shown in FIG. 16B, are folded inward by the punch 5a and disposed so as to be arranged on the tip end face of the pin fin 92a. Therefore, a stepped portion is formed on the tip end face of the pin fin by the burrs 95. When the stepped portion is formed on the tip end face of the pin fin 92a as mentioned above, in the same manner as in the case in which there exist variations in the heights of the pin fins 92, it becomes difficult to join the metal plate 8 to each pin fin 92a in an excellent state, thereby causing joining defects.

On the other hand, in the heat sink 9 of this embodiment, the tip end convex portion 931, which is a portion higher than the burrs 95 of the joining convex portion 93 of each pin fin 92, is pressed to match the height of each pin fin 92. Therefore, the burrs 95 will not be crushed, and the burrs 95 are prevented from being arranged on the tip end face of the pin fin 92a, which prevents stepped portions from being formed on the tip end face of the pin fin 92a by the burrs 95. Therefore, in the same manner as in the heat sink 9 shown in FIG. 6C, the brazing material 82 sufficiently fills the space between the peripheral portion of the joining convex portion 93 of the pin fin 92 and the metal plate 81. As a result, nearly the entire area of the tip end of each pin fin 92 and the metal plate 81 can be fixedly joined directly or via the brazing material 82.

In this embodiment, as shown in FIG. 6D, when the height (H1-H2) of the tip end convex portion 931 of the joining convex portion 93 of the pin fin 92 is defined as "ΔH", it is required to set that the correction amount (pushed-in amount) to be provided on the tip end convex portion 931 is equal to or less than the height ΔH of the tip end convex portion 931. Specifically, it is preferred that the correction amount of the tip end convex portion 931 is set to 0.2 mm or less. That is, if the correction amount is too large, the pin fin 92 is buckled and distorted, and excellent dimensional accuracy may not be obtained.

Further, in this embodiment, even in cases where the heat sink 9 and the metal plate 81 are joined after performing the correction step by pressing, in the same manner as mentioned above, the heat sink 9 and the metal plate 81 can be joined in an excellent condition by brazing. Furthermore, in this embodiment, the heat sink 9 and the metal plate 81 can be joined in an excellent condition in the same manner as in mentioned above by joining methods other than brazing, such as, e.g., friction stir welding or joining using an adhesive agent.

In this embodiment, the heat sink 9 and the metal plate 81 can be joined by effectively using the thin protruded portions 951 constituted by the burrs 95 which are excessive portions.

As shown in FIG. 6C, since the thin protruded portion 951 is integrated or welded and coalesced to the fillet 83 by the brazing material 82, the brazing material 82 sufficiently fills the space between the pin fin 92 and the metal plate 81 without a gap in the periphery of the thin protruded portion 951. Further, as described above, fillets 83 are formed also in the periphery of the joining convex portion 93 by the brazing material 82, and thus the pin fins 92 and the metal plate 81 are joined directly or via the brazing material 82 without a gap. In this way, from the synergy effect of the joining convex portion 93 and the thin protruded portion 951, almost the entire area of the tip end of the pin fin 92 and the metal plate 81 can be joined without a gap, and the heat sink 9 and the metal plate 81 can be joined in an excellent condition.

Further, in the heat sink 9 of the present invention, as shown in FIG. 6D, an annular groove (cavity) is formed between the joining convex portion 93 at the tip end of the pin fin 92 and the thin protruded portion 951. Therefore, the pin fin 92 and the metal plate 81 can be joined in a state in which a flux is accumulated in the annular groove. Therefore, an enough amount of flux can be secured to thereby assuredly prevent occurrences of joining defects due to insufficiency of flux. Therefore, the heat sink 9 and the metal plate 81 can be joined in an even better condition.

In the aforementioned present embodiment, even in the case of effectively utilizing the thin protruded portion 951, the shape of the thin protruded portion 951 is not limited to the above. For example, as shown in FIG. 6A, the height H2 of the thin protruded portion 951 does not necessarily need to be lower than the height H1 of the joining convex portion 93, and the height H2 of the thin protruded portion 951 can be formed to be the same as the height H1 of the joining convex portion 93 or higher than the height H1. In fact, in the present invention, as described above, it is preferable that the height H2 of the thin protruded portion 951 is formed to be the same as the height H1 of the joining convex portion 93 or lower than the height H1 of the joining convex portion 93.

Furthermore, for the thin protruded portion 951, it is not required that the height H2 is constant along the entire circumferential direction and the height H2 can vary depending on the position in the circumferential direction.

Furthermore, it is not required that the thin protruded portion 951 is formed continuously in the circumferential direction on the tip end face of the pin fin 92, and can be provided in the circumferential direction at intervals. Importantly, it is enough that the thin protruded portion 951 is formed on at least one portion in the circumferential direction.

Furthermore, it is not required that the thin protruded portion 951 is formed on every pin fin 92, and can be formed on at least some of the pin fins 92.

In this embodiment, the thin protruded portion 951 are formed by burrs 95, which are excessive portions, but the present invention is not limited to that, and the thin protruded portions 951 can be intentionally formed by forging.

Figure 10A:
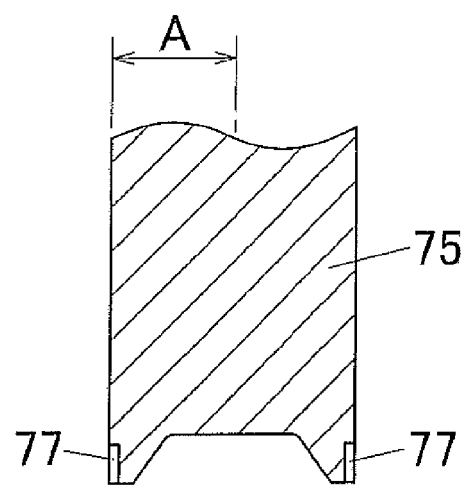
FIG. 10A is a cross-sectional view showing a tip end portion of a back pressure applying pin of a first modified embodiment of the present invention.
Figure 10B:
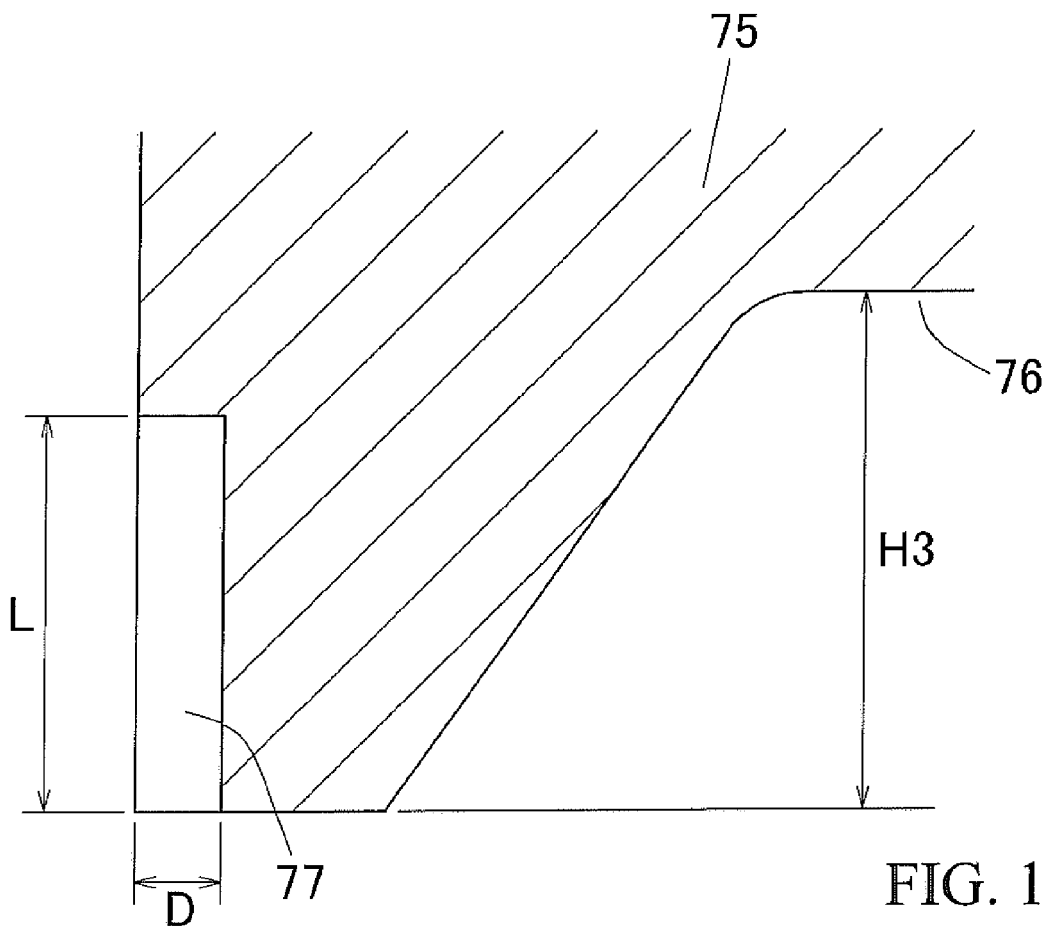
FIG. 10B is an enlarged cross-sectional view showing the vicinity of the concave stepped portion for forming a thin protruded portion of the back pressure applying pin of the first modified embodiment of the present invention.

For example, as shown in FIGS. 10A and 10B, a concave stepped portion 77 for forming a thin protruded portion that opens to the tip end side (lower side) is formed on the tip end outer peripheral surface of the back pressure applying pin 75 used for the forging of the heat sink. In the same manner as mentioned above, using the back pressure applying pin 75, the heat sink 9 can be formed by forging. In this way, at the time of forging, a crow-shaped thin protruded portion 951 can be integrally formed on the tip end outer peripheral edge of the pin fin 92.

When looking at the back pressure applying pin 75 from the tip end side in the axial direction, when it is defined that the radius which is a dimension from the axial center to the outline is "A", the depth of the concave stepped portion 77 is "D", the length of the concave stepped portion 77 is "L", and the depth of the concave portion 76 is "H3," it is preferable that the depth D of the concave stepped portion is set to 10% or less than the length L of the concave stepped portion. It is preferable to satisfy the relational expression of D≤A×1/10. That is, by satisfying the relational expression, at the time of forging, the metal material can be assuredly filled in the concave stepped portion 77, which enables assured forming of a desired thin protruded portion 951.

Furthermore, in the case of filling the metal material into the concave stepped portion 77 at the time of forging, it is preferable set to L≤H3, more preferably L<H3. That is, by satisfying the relational expression, the heat sink 9 in which the joining convex portion 93 of the pin fin 92 is the same in height as the thin protruded portion 95 or higher than the thin protruded portion 95.

In addition, in cases where the metal material is not filled in the concave stepped portion 77 at the time of forging, that is, when the amount of metal material flowing into the concave stepped portion 77 is not controlled, it is not required to satisfy the aforementioned relational expression. For example, the length L of the concave stepped portion 77 can be set to be 200% or less with respect to the depth D of the concave portion 76.

Figure 10C:
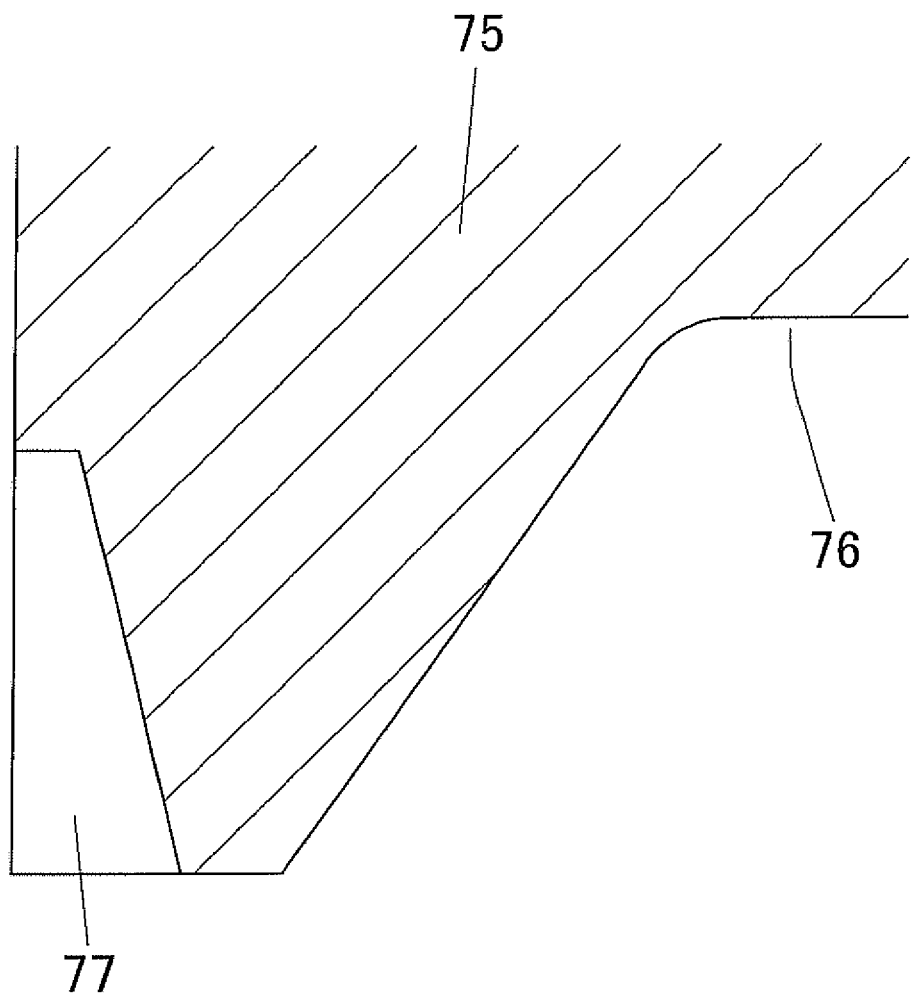
FIG. 10C is an enlarged cross-sectional view showing the vicinity of the concave stepped portion for forming a thin protruded portion of the back pressure applying pin of a second modified embodiment of the present invention.

Further, as shown in FIG. 10C, the concave stepped portion 77 can be formed so that the bottom surface is formed into a tapered shape so that the bottom surface gradually becomes closer to the axial center of the back pressure applying pin 75 toward the tip end. With this structure, the metal material can be smoothly filled in the concave stepped portion 77, so the die release operation of the thin protruded portion 951 can also be performed smoothly.

In the present invention, the following structures [a] to [d] are preferably employed to effectively use the thin protruded portion 951 such as burrs 95.

[a] A forging method for forming a heat sink including a base board and a plurality of pin fins integrally formed on at least one surface of the base board by plastically deforming a forging blank by die forging processing, the method comprising:

arranging a back pressure applying pin in a fin-forming hole for forming the pin fin in a slidable manner, the fin-forming hole being formed in a forging die;

applying a back pressure to a metal material of the forging blank which flows into the fin-forming hole with the back pressure applying pin at a time of plastically deforming the forging blank;

forming a concave portion on a restraining tip end face of the back pressure applying pin for restraining the metal material; and integrally forming a joining convex portion on a tip end of the pin fin by the metal material filled in the concave portion, wherein a thin protruded portion is formed at least on a portion of the tip end peripheral edge of the pin fin by the metal material filling the gap between the tip end outer peripheral surface of the back pressure applying pin and the inner peripheral surface of the fin-forming hole.

[b] The forging method as recited in the aforementioned Item [a], wherein the thin protruded portion is constituted by burrs.

[c] The forging method as recited in the aforementioned Item [a], wherein a concave stepped portion is formed on a tip end outer peripheral surface of the back pressure applying pin, and the thin protruded portion is constituted by the metal material filled in the concave stepped portion.

[d] The forging method as recited in any one of the aforementioned Items [a] to [c], wherein the thin protruded portion is provided on an entire area in the circumference of the tip end outer peripheral edge of the pin fin.

Figure 11:
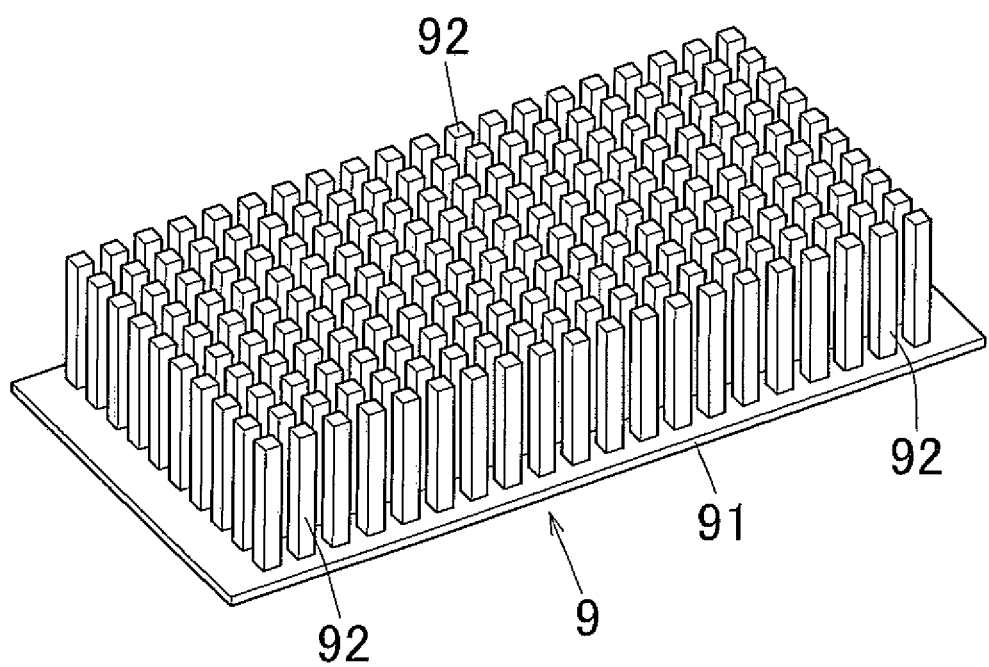
FIG. 11 is a perspective view showing a heat sink of a third modified embodiment of the present invention.

The aforementioned embodiments were explained by exemplifying a case in which the heat sink 9 having a pin fin 92 circular in cross-section was produced, but the shape of the pin fin in the present invention is not specifically limited. For example, as shown in FIG. 11, a heat sink 9 having a pin fin 92 square in cross-section (horizontal cross section) can be produced. Other than that, a heat sink having a pin fin polygonal in cross-section, elliptical in cross-section, oval in cross-section, or star in cross-section, or variant in cross-section, can be produced. Furthermore, a heat sink having plural types of pin fins different in shape can be produced.

Needless to say, in the present invention, the number of pin fins formed on the heat sink is not limited.

Figure 12A:
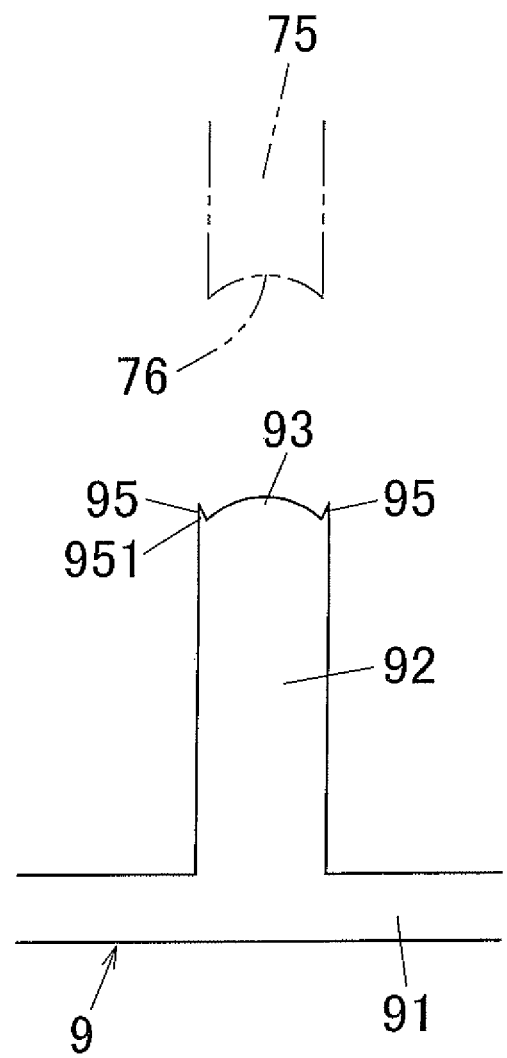
FIG. 12A is a cross-sectional view showing a pin fin of a heat sink of a fourth modified embodiment of the present invention.
Figure 12B:
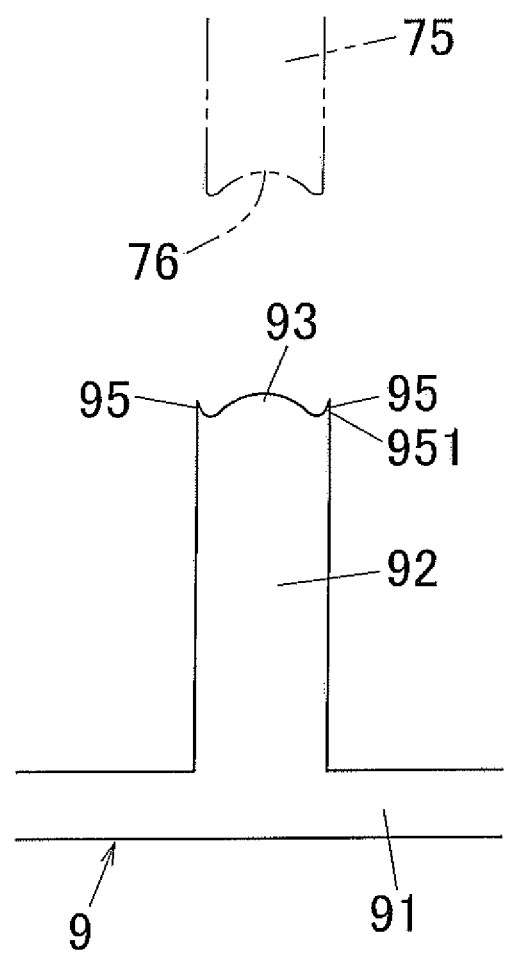
FIG. 12B is a cross-sectional view showing a pin fin of a heat sink of a fifth modified embodiment of the present invention.

Also, in the aforementioned embodiments, the concave portion 76 of the restraining tip end face of the back pressure applying pin 75 was formed into a conical trapezoid shape to form a conical trapezoidal shaped joining convex portion 93 on the tip end of the pin fin of the heat sink 9, but in the present invention, the shape is not specifically limited. For example, as shown in FIG. 12A, the shape of the concave portion 76 of the back pressure applying pin 75 and the joining convex portion 93 of the tip end of the pin fin can be formed into a dome-shape or a small dome-shape as shown in FIG. 12B.

Furthermore, in the present invention, the horizontal cross-sectional shape of the concave portions 76 of the back pressure applying pin 75 and the joining convex portion 93 of the tip end of the pin fin are not specifically limited, and can be formed into a polygonal shape such as a triangular shape or a rectangular shape, an elliptical shape, an oval shape, or a star shape or a variable cross-sectional shape, rather than a circular cross-sectional shape as shown in the aforementioned embodiment. Furthermore, plural types of back pressure applying pins different in the shape of the concave portion can be mixed.

In the aforementioned embodiment, the metal plate 81 is fixed to the heat sink 9 by the brazing material 82. In the present invention, however, the fixing mechanism of the heat sink 9 and the metal plate 81 is not limited to the aforementioned mechanisms. As described above, the heat sink and the metal plate can be fixed by an adhesive agent excellent in thermal conductivity (including a pressure sensitive adhesive) or friction stir welding. In this case, in the same manner as in the aforementioned embodiment, it is preferable that the tip end of the joining convex portion 93 at the tip end of the pin fin of the heat sink is formed into a flat surface.

In the aforementioned embodiment, as a heat transfer plate to be fixedly joined to the heat sink, a metal plate made of aluminum alloy is attached, but not limited to it. In the present invention, a metal plate other than an aluminum alloy metal plate or a resin plate can also be used as a heat transfer plate.

Further, in this embodiment, a spring is used as a biasing mechanism for the back pressure applying structure, but the present invention is not limited to that. For example, a gas cushion can be used as a biasing mechanism.

This application claims priority to Japanese Patent Application No. 2011-46260 filed on Mar. 3, 2011, and the entire disclosure of which is incorporated herein by reference in its entirety.

It should be understood that the terms and expressions used herein are used for explanation and have no intention to be used to construe in a limited manner, do not eliminate any equivalents of features shown and mentioned herein, and allow various modifications falling within the claimed scope of the present invention.

While the present invention may be embodied in many different forms, a number of illustrative embodiments are described herein with the understanding that the present disclosure is to be considered as providing embodiments of the principles of the invention and such embodiments are not intended to limit the invention to preferred embodiments described herein and/or illustrated herein.

While illustrative embodiments of the invention have been described herein, the present invention is not limited to the various preferred embodiments described herein, but includes any and all embodiments having equivalent elements, modifications, omissions, combinations (e.g., of aspects across various embodiments), adaptations and/or alterations as would be appreciated by those in the art based on the present disclosure. The limitations in the claims are to be interpreted broadly based on the language employed in the claims and not limited to embodiments described in the present specification or during the prosecution of the application, which embodiments are to be construed as non-exclusive.

INDUSTRIAL APPLICABILITY

The forging method of the present invention can be used for, e.g., producing a pin fin-type heat sink.

DESCRIPTION OF THE REFERENCE NUMERALS

1 . . . die
5 . . . punch
5a . . . corrective punch
52 . . . fin forming hole
75 . . . back pressure applying pin
76 . . . concave portion
81 . . . metal plate (heat transfer plate)
9 . . . heat sink
91 . . . base board
92 . . . pin fin
93 . . . joining convex portion
95 . . . burrs
951 . . . thin protruded portion
W . . . forging blank

The invention claimed is:

1. A forging method for forming a heat sink including a base board and a plurality of pin fins integrally formed on at least one surface of the base board by plastically deforming a forging blank by die forging processing, the method comprising:
arranging a back pressure applying pin in a fin-forming hole for forming the pin fin in a slidable manner, the fin-forming hole being formed in a forging die, wherein the back pressure applying in includes a concave portion on a restraining tip end face of the back pressure applying pin;
applying a back pressure to a metal material of the forging blank flowing into the fin-forming hole with the back pressure applying pin at a time of plastically deforming the forging blank;
restraining the metal material with the concave portion on the restraining tip end face of the back pressure applying pin; and
integrally forming a joining convex portion on a tip end of the pin fin by the metal material filled in the concave portion.

2. The forging method as recited in claim 1, wherein the joining convex portion of the pin fin protrudes higher than a thin protruded portion formed at a tip end outer peripheral edge of the pin fin.

3. The forging method as recited in claim 2, wherein the thin protruded portion is formed by burrs.

4. The forging method as recited in claim 1, wherein a tip end of the joining convex portion of the pin fin is formed into a flat surface.

5. The forging method as recited in claim 1, wherein the forging die includes a punch and a die, and wherein the fin-forming hole is provided in the punch.

6. The forging method as recited in claim 1, wherein the forging die includes a punch and a die, and wherein the fin-forming hole is provided in the die.

7. A production method of a heat sink including a heat transfer plate, the method comprising:
a step of obtaining a heat sink by a forging method as recited in claim 1; and
a step of fixedly joining a heat transfer plate to tip ends of a plurality of pin fins without removing thin protruded portions formed at tip end outer peripheral edges of the plurality of pin fins of the heat sink.

8. A production method of a heat sink including a heat transfer plate, the method comprising:
a step of obtaining a heat sink by a forging method as recited in claim 1;
a correction step of adjusting protruding amounts of joining convex portions of a plurality of pin fins of the heat sink by pressing a corrective punch having a flat pressing surface against tip ends of the plurality of pin fins; and
a joining step of fixedly joining a heat transfer plate to the tip ends of the plurality of pin fins after performing the correction step.

9. A correction method of a heat sink, comprising:
a step of obtaining a heat sink by a forging method as recited in claim 1; and
a correction step of adjusting protruding amounts of joining convex portions of a plurality of pin fins of the heat sink by pressing a corrective punch having a flat pressing surface against tip ends of the plurality of pin fins.

10. A forging device for forming a heat sink including a base board and a plurality of pin fins integrally formed on at least one surface of the base board by plastically deforming a forging blank by die forging processing, the forging device comprising:
a forging die;
a back pressure applying pin arranged in a fin-forming hole of the forging die, wherein
a restraining tip end face of the back pressure applying in includes a concave portion that restrains a metal material of the forging blank so that a joining convex portion is integrally formed on a tip end of a pin fin by the metal material filled in the concave portion.

* * * * *